United States Patent
Katayama et al.

(10) Patent No.: US 8,037,395 B2
(45) Date of Patent: Oct. 11, 2011

(54) ENCODING AND DECODING METHOD FOR PACKET RECOVERY

(75) Inventors: Yasunao Katayama, Hachiouji (JP); Daiju Nakano, Sagamihara (JP)

(73) Assignee: International Business Machines Corporation, Armonk, NY (US)

( * ) Notice: Subject to any disclaimer, the term of this patent is extended or adjusted under 35 U.S.C. 154(b) by 1073 days.

(21) Appl. No.: 11/773,117

(22) Filed: Jul. 3, 2007

(65) Prior Publication Data

US 2008/0022182 A1 Jan. 24, 2008

(30) Foreign Application Priority Data

Jul. 3, 2006 (JP) .................. 2006-182985

(51) Int. Cl.
*H03M 13/00* (2006.01)
(52) U.S. Cl. .................. 714/784; 714/752; 714/758
(58) Field of Classification Search .................. 714/752, 714/784
See application file for complete search history.

(56) References Cited

U.S. PATENT DOCUMENTS 6,145,109 A * 11/2000 Schuster et al. .............. 714/752
7,698,618 B2 * 4/2010 Oliva et al. .................... 714/752

FOREIGN PATENT DOCUMENTS

JP 2006/333106 2/1994

OTHER PUBLICATIONS

Nonnenmacher, E. W. Biersack, and D. Towsley, "Parity-based loss recovery for reliable multicast," IEEE/ACM Trans. Networking, vol. 6, pp. 349.361, Aug. 1998. Luby, M. Mitzenmacher, A. Shokrollahi, and D. Spielman.
"Efficient erasure correcting codes," IEEE Trans. Inform. Theory, vol. 47, pp. 569.584, Feb. 2001. M. Arai, A. Yamaguchi, K. Iwasaki. "Method to Recover Internet Packet Losses Using (n, n—1, m) Convolutional Codes," IEEE Dependable System and Network, pp. 382-389, 2000. Fumio Koike/Japan/IBM Sep. 25, 2006.

* cited by examiner

*Primary Examiner* — Sam Rizk
(74) *Attorney, Agent, or Firm* — David A. Cain

(57) ABSTRACT

A Partially-Overlapped Block (POB) code used in an encoding and decoding method in which a plurality of different block codes are combined so that the block codes partially overlap one another. A method for recovering a plurality of packets by using a loss correction capability of this encoding method in which a larger number of packets than the number of added redundant packets per frame are recovered, by reusing redundant information of neighboring frames effectively, without increasing the asymptotic complexity of its decoding algorithm.

16 Claims, 17 Drawing Sheets (a)

(b)

(a)

(b)

ENCODING AND DECODING METHOD FOR PACKET RECOVERY

CROSS REFERENCE TO RELATED APPLICATION

This application claims priority to Japanese Patent Application No. 2006-182985, filed on Jul. 3, 2006.

FIELD OF THE INVENTION

The present invention generally relates to packet recovery used in digital communications. More specifically, the present invention relates to an encoding method, a decoding method, an encoder and a decoder circuit elements for packet recovery.

BACKGROUND OF THE INVENTION

An encoding technique for packet recovery and a decoding technique corresponding to the encoding technique have been increasingly important for wired or wireless network applications. The reason for this is that an increase in a data transfer speed brings about packet losses more often, while the conventional packet recovery method based on retransmission of packets increases performance overhead and buffer management overhead. Here, packet losses occur due to congestion attributed to errors in the detection of a header/synchronization pattern attributed to a temporary concentration of data packets at a network switch.

One prior art technique for solving the foregoing problems, encodes packets on a frame-by-frame basis using a block code such as an interleaved Reed Solomon (RS) erasure correcting code (Nonnenmacher, E. W. Biersack, and D. Towsley, "Parity-based loss recovery for reliable multicast," IEEE/ACM Trans. Networking, vol. 6, pp. 349.361, August 1998.). In this conventional technique, however, a redundant packet is not used, and is just wasted when there are no lost packets in a given frame. This inefficiency can be reduced when a code length is set to be longer. At the same time, however longer code lengths result in an increase in the computational complexity for decoding.

As another prior art technique involves performing decoding by using a nonsystematic code specific to packet recovery, on the basis of a graph structure consisting of source nodes and check nodes which are commonly used by a sender and a receiver (Luby, M. Mitzenmacher, A. Shokrollahi, and D. Spielman, "Efficient erasure correcting codes," IEEE Trans. Inform. Theory, vol. 47, pp. 569. 584, February 2001.). A non-systematic code is effective in terms of an encoding rate, and is efficient since it exhibits a substantially linear latency for decoding. Non-systematic codes, however, are not particularly efficient in terms of required bandwidth. Moreover, the efficiency of a hardware implementation of this method is similarly lacking due to random graph structures. For this reason, the application range of this method is limited to streaming media and data delivery for which encoding and decoding are implemented with software.

As still another conventional technique, there is a method for packet recovery using convolutional codes of (n, n−1, m) (M. Arai, A. Yamaguchi, K. Iwasaki, "Method to Recover Internet Packet Losses Using (n, n−1, m) Convolutional Codes," IEEE Dependable System and Network, pp. 382-389, 2000.). In this method, a lost packet can be recovered more flexibly than a frame-based technique using block codes. Nevertheless, this method is based on a binary convolutional code, and thereby requires a loss correction on a bit-by-bit basis. For this reason, this method does not allow decoding on a symbol-by-symbol basis to be performed. Accordingly, it is necessary to arrange a large number of decoders in parallel rendering a costly hardware implementation in terms of area.

The foregoing conventional techniques for packet recovery suffer from inefficiencies related to longer code length, more complexity in implementation of a decoder circuit, etc. In addition, an excessive addition of redundant information may cause new congestion.

SUMMARY OF THE INVENTION

An object of the present invention is to provide a novel encoding method with which a packet recovery rate can be improved while an appropriate amount of redundant information is effectively utilized, and a decoding method corresponding to the new encoding method. Another object of the present invention is to provide a new encoder and a decoder for achieving these above methods.

The present invention discloses a Partially-Overlapped Block (POB) code for encoding of packetized data, which combines a plurality of different block codes, such that the block codes partially overlap one another. A decoding method corresponding to this encoding method is also disclosed herein. In a further aspect of the invention a method of recovering a plurality of packets by exploiting the loss correction capability of the code is also disclosed. The present invention enables recovery of a greater number of packets than the number of added redundant packets per frame, by effectively reusing redundant information of the neighboring frames, without increasing the asymptotic complexity of its decoding algorithm.

Provided is an encoder for the purpose of generating a POB code of the present invention. The encoder detects data frames and generates a parity bit for each sub-frame where a plurality of block codes partially overlap one another.

The decoder method and structure disclosed herein includes an element for detecting a frame and enables storage of a number of sub-frames equal to the block codes which overlap one another. The decoder function also generates ECC syndromes for the respective sub-frames using different check matrices. The decoder also determines a pattern for correcting an error by using information on a packet error location and the number of packet errors. Once a total number of errors are obtained, the individual bit errors are corrected and the ECC syndrome is recomputed with the corrected data.

BRIEF DESCRIPTION OF THE DRAWINGS

For a more complete understanding of the present invention and the advantage thereof, reference is now made to the following description taken in conjunction with the accompanying drawings, in which.

DETAILED DESCRIPTION OF THE PREFERRED EMBODIMENT

Figure 1:
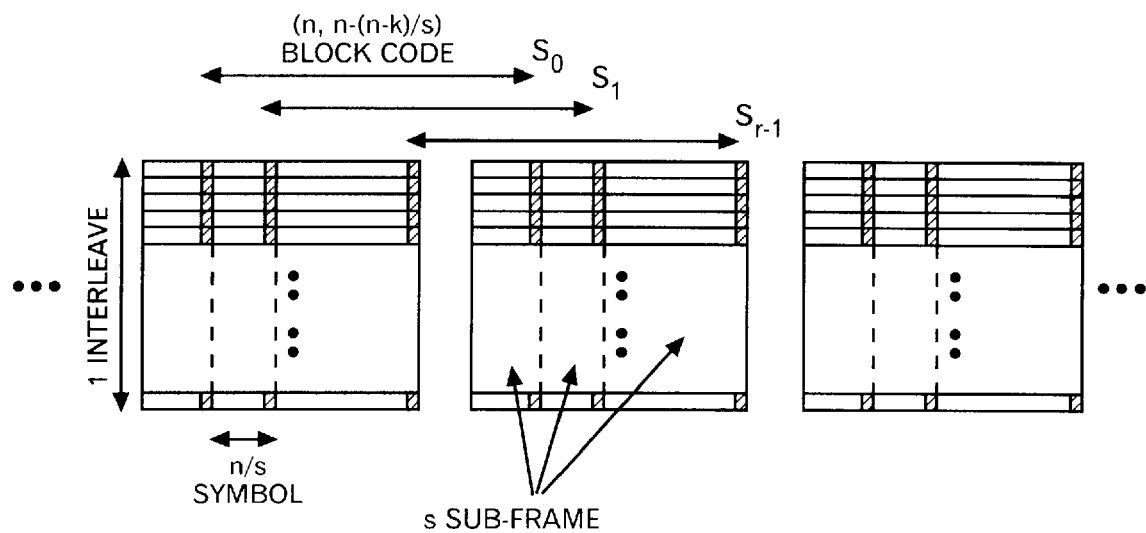
FIG. 1 is a diagram showing a code structure of a POB code of the present invention.

Hereinafter, detailed descriptions will be given of the present invention by referring to the drawings. A POB code of the present invention uses a code structure shown in FIG. 1. Suppose that, if a structure includes n symbols interleaved L times in one frame, a codeword w in each frame can be divided into s sub-frames ($w_h$) including redundant symbols (Suppose that both n and r can be divided by s). In other words, suppose that each of the sub-frames of n/s symbols includes r/s redundant symbols.

Then, s (n, n−r/s) non-binary block codes that are different from one another are encoded so as to satisfy the following parity check condition:

$$\sum_{h=j-s+1}^{j} H_{ih} w_h = 0, \quad (1)$$

where, $$H_i = [H_{i(j-s+1)}, H_{i(j-s+2)}, \ldots, H_{ij}], \quad (2)$$
$$H_{ih} = [\alpha^{ih*n/s}, \alpha^{i(h*n/s+1)}, \ldots, \alpha^{i(h*n/s+n/s-1)}];$$

H is a generator matrix; w is a codeword; α is a primitive element in a Galois field, s is the number of block codes (equal to the number of divided sub-frames); n is a block size, and k is the information size, and note that k=(n−r)/s; r is the parity size; and j is a sub-frame number. Each code is not necessarily used in the current frame, but is used within a range of the symbol set $w_j$ in the j-th sub-frame, to the symbol sets $w_{j-s-1}$, $w_{j-s-2}$, ..., $w_{j-1}$ in s−1 sub-frames preceding the j-th sub-frame. In addition, i is a suffix for identifying an encoding condition, and the equation jr/s=<i<(j+1)r/s is satisfied. h* denotes a relative location (h*=0, 1, 2, ..., s−1) in the h-th sub-frame in the frame.

Decoding is carried out in the following steps. Here, paying attention to a certain j-th sub-frame, if there are no packet errors in the preceding s−1 sub-frames, or if all the errors in the s−1 sub-frames are corrected, the code decoding, which is proposed in this disclosure, is similar to a block code loss correction. Firstly, syndromes are computed, and then the symbol information on a lost packet is found by using the information on a lost location. The i-th syndrome $S_i$(jr/s=<i< (j+1)r/s), which is added to the end of the j-th sub-frame, is computed by using $H_i$ and received data $w_{j-s-1}$, $w_{j-s-2}$, ..., $w_j$.

$$S_i = \sum_{h=j-s+1}^{j} H_{ih} w_h, \quad (3)$$

where other marks, to which an asterisk (*) is added, such as j* is defined in the same manner as is the case with h*.

If the total number of lost packets in the h sub-frames, the head of which is the j-th sub-frame, is less than p=rh/s, the lost packets can be always recovered. For example, if a packet is not lost in the h−1 sub-frames following the current sub-frame, up to p packets can be recovered. In other words, in a case where q(q=<p) packet data $b_{e0}$, $b_{e1}$, ..., $b_{eq-1}$ are lost in the locations $e_0$, $e_1$, ..., $e_{q-1}$, respectively, the packets can be recovered by solving the following linear equation which is similar to that in a case of a RS code loss correction.

$$\begin{bmatrix} S_{(jr/s)*} \\ S_{(1+jr/s)*} \\ S_{(2+jr/s)*} \\ \vdots \\ S_{(q-1+jr/s)*} \end{bmatrix} = \begin{bmatrix} \alpha^{(jr/s)*e_0} & \alpha^{(jr/s)*e_1} & \cdots & \alpha^{(jr/s)*e_{q-1}} \\ \alpha^{(1+jr/s)*e_0} & \alpha^{(1+jr/s)*e_1} & \cdots & \alpha^{(1+jr/s)*e_{q-1}} \\ \alpha^{(2+jr/s)*e_0} & \alpha^{(2+jr/s)*e_1} & \cdots & \alpha^{(2+jr/s)*e_{q-1}} \\ \vdots & \vdots & & \vdots \\ \alpha^{(q-1+jr/s)*e_0} & \alpha^{(q-1+jr/s)*e_1} & \cdots & \alpha^{(q-1+jr/s)*e_{q-1}} \end{bmatrix} \begin{bmatrix} b_{e_0} \\ b_{e_1} \\ \vdots \\ b_{e_{q-1}} \end{bmatrix}. \quad (4)$$

Once all the packets lost in the current sub-frame are recovered, a syndrome needs to be re-computed at each border between sub-frames. This syndrome re-computing step allows the maximum number of correctable packets per frame to be equal to, or more than r, which prevents the costs of the computation from increasing. A new re-computed syndrome $S_i'$ can be computed by using the following formula.

$$\begin{bmatrix} S_0' \\ S_1' \\ S_2' \\ \vdots \\ S_{r-1}' \end{bmatrix} = \begin{bmatrix} S_0 \\ S_1 \\ S_2 \\ \vdots \\ S_{r-1} \end{bmatrix} + \begin{bmatrix} 1 & 1 & \cdots & 1 \\ \alpha^{e_0} & \alpha^{e_1} & \cdots & \alpha^{e_{q-1}} \\ \alpha^{2e_0} & \alpha^{2e_1} & \cdots & \alpha^{2e_{q-1}} \\ \vdots & \vdots & & \vdots \\ \alpha^{(r-1)e_0} & \alpha^{(r-1)e_1} & \cdots & \alpha^{(r-1)e_{q-1}} \end{bmatrix} \begin{bmatrix} b_{e_0} \\ b_{e_1} \\ \vdots \\ b_{e_{q-1}} \end{bmatrix}, \quad (5)$$

where α is a primitive element of the Galois field; $b_{e0}$, $b_{e1}, \ldots, b_{eq-1}$ are packet information on q(q=<p) packets; and $e_0, e_1, \ldots, e_{q-1}$ are locations in packets.

When the total number h of packets lost in the sub-frames is larger than p, the lost packets cannot be recovered. In this case, the (2s−1) successive sub-frames should be correct for restarting a packet recovery operation. Although the asymptotic complexity for decoding in this case is not different from decoding block codes, a decoding algorithm needs to be changed, in practice, according to a pattern of the number of errors in the sub-frames. Accordingly, it is important to design a decoder circuit appropriately so that the size of a decoder would be realistic. In particular, the actual decoding computation is influenced by a location where a sub-frame to be currently corrected is placed in a frame. Efficient hardware implementation of a decoder requires a careful consideration of this point. A reduction in the number of multipliers is more important for a reduction in a circuit size than for a reduction in the number of multiplications.

Figure 2:
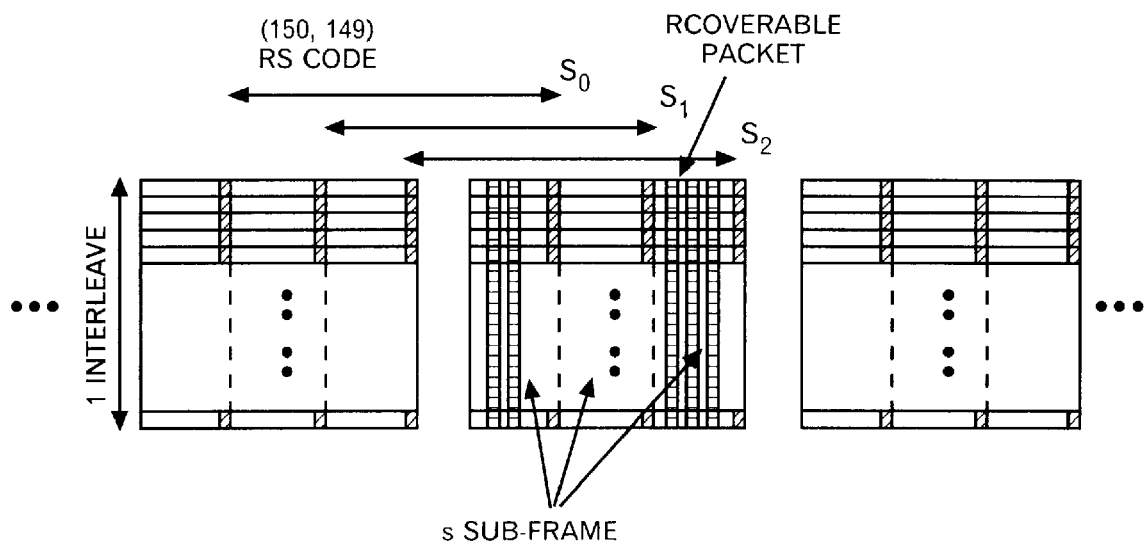
FIG. 2 is a diagram showing a code structure of an example of the POB code of the present invention.

FIG. 2 shows a code structure of an example of a POB code. Here, a symbol frame (n=150) is divided into sub-frames (s=3, and each sub-frame includes n/s=50 symbols). Then, a packet is recovered by using three (150, 149) RS codes (generated respectively where the parity check conditions are 1, α and $\alpha^2$). To be more precise, the RS codes are expressed as follows:

$$H_0 = [1, 1, \ldots, 1, 1, 1 \ldots, 1, 1, 1, \ldots, 1], \quad (6)$$

$$H_1 = [\alpha^{100}, \alpha^{101}, \ldots, \alpha^{149}, \alpha^0, \alpha^1, \ldots, \alpha^{49}, \alpha^{50}, \alpha^{51}, \ldots, \alpha^{99}],$$

$$H_2 = [\alpha^0, \alpha^2, \ldots, \alpha^{98}, \alpha^{100}, \alpha^{102}, \ldots, \alpha^{198}, \alpha^{200}, \alpha^{202}, \ldots, \alpha^{298}],$$

where data $w_j$ in the j-th sub-frame satisfies the following relationship:

$$\sum_{h=j-2}^{j} H_{ih} w_h = 0, \quad (7)$$

where the suffix i indicates which parity check condition is used. i changes in line with the relative location j* in the j-th sub-frame. For example, the suffix i can be changed to be i=j*.

Table 1 shows corresponding relationships between the j-th, j+1-th and j+2-th sub-frames, and the numbers of lost packets that can be recovered. The symbol value be is the one lost at a location e in the sub-frame located at a position j* (positions 0, 1 or 2) in the frame, and can be computed by using information on other lost locations e' and e", if needed.

TABLE 1

| Case | j | j + 1 | j + 2 |
|---|---|---|---|
| A | 1 | — | — |
| B | 2 | 0 | — |
| C | 2 | 1 | 0 |
| D | 3 | 0 | 0 |

CASE A
$$b_e = \begin{cases} S_0 & \text{if } j^* = 0 \\ S_1/\alpha^e & \text{if } j^* = 1 \\ S_2/\alpha^{2e} & \text{if } j^* = 2 \end{cases}$$

TABLE 1-continued

CASE B
$$b_e = \begin{cases} \dfrac{\alpha^{e'} S_0 + S_1}{\alpha^e + \alpha^{e'}} & \text{if } j^* = 0 \\[6pt] \dfrac{\alpha^{e'} S_1 + S_2}{\alpha^e(\alpha^e + \alpha^{e'})} & \text{if } j^* = 1 \\[6pt] \dfrac{\alpha^{2e'} S_0 + S_2}{\alpha^e(\alpha^e + \alpha^{e'})2} & \text{if } j^* = 2 \end{cases}$$

CASE C
$$b_e = \begin{cases} \dfrac{\alpha^{e'}(\alpha^{e'} + \alpha^{e''})S_0 + \alpha^{e''} S_1 + S_2}{(\alpha^e + \alpha^{e'})(\alpha^e + \alpha^{e'} + \alpha^{e''})} & \text{if } j^* = 0 \\[6pt] \dfrac{\alpha^{2e''} S_0 + (\alpha^{e'} + \alpha^{e''})S_1 + \alpha^{e'} + S_2}{(\alpha^e + \alpha^{e'})(\alpha^e \alpha^{e'} + \alpha^{e''})} & \text{if } j^* = 1 \\[6pt] \dfrac{\alpha^{2e'} \alpha^{e''} S_0 + \alpha^{2e'} S_1 + (\alpha^{e'} + \alpha^{e''})S_2}{(\alpha^e + \alpha^{e'})((\alpha^e + \alpha^{e'})\alpha^{e''}) + \alpha^e \alpha^{e'})} & \text{if } j^* = 2 \end{cases}$$

CASE D
$$b_e = \dfrac{\alpha^{e'} \alpha^{2e''} S_0 + (\alpha^{e'} + \alpha^{e''})S_1 + S_2}{(\alpha^e + \alpha^{e'})(\alpha^e + \alpha^{e''})}$$

In the case C, e and e' are in the same sub-frame, while e" is in the next sub-frame.

Figure 3:
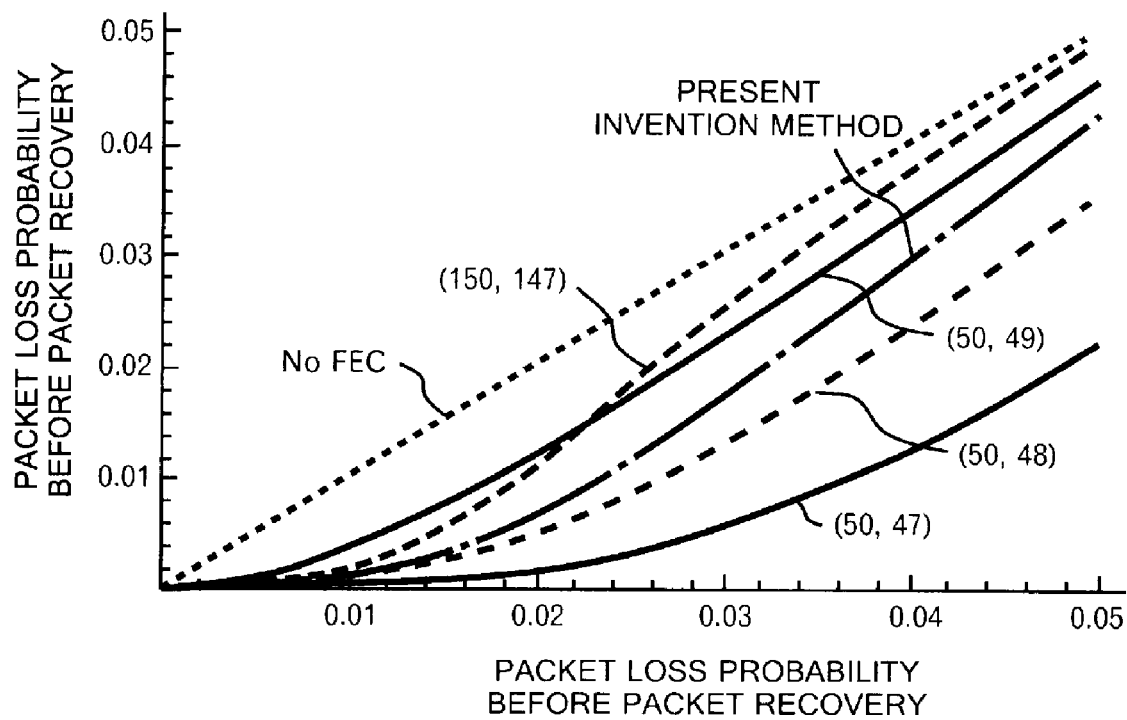
FIG. 3 is a diagram showing an effect of packet recovery in a case where a POB encoding method of the present invention is used.

FIG. 3 shows an effect of the present invention by comparing the structure example of the present invention shown in FIG. 2, with the other examples of the conventional techniques. In FIG. 3, the x-axis denotes the packet loss probability at a time when inputted, and the y-axis denotes the packet loss probability after each type of packet recovery mechanism is used. Firstly, the method of the present invention is compared with a conventional method using a (150, 147) RS code. Although both methods use the same code rate, the maximum number of recoverable packets per frame is three in the case of the conventional method, while the maximum number thereof is five in the case of the present invention. Next, the method of the present invention is compared with a method using a (50, 48) RS code. By using half of the amount of redundant packets in the conventional method, the method of the present invention shows substantially the same recovery capability in an area where the packet loss rate is small.

In addition, in comparison with the method described in Non-Patent Document 2, the method of the present invention does not use a random LDPC code, but a code having a structure based on the block codes. Accordingly, the method of the present invention is suitable for hardware implementation, and shows an effect even in a case where a code length is relatively short. Furthermore, comparing the method of the present invention with the method using a binary convolutional code, the method of present invention makes it possible to make corrections on a symbol-by-symbol basis, and thereby achieves improved efficiency in hardware implementation than the method of recovering packets on a bit-by-bit basis.

Hereinafter, descriptions will be given of a decoding method, an encoder and a decoder that support the POB code of the present invention. To begin with, the POB encoding method will be again explained by using a specific example.

Figure 4:
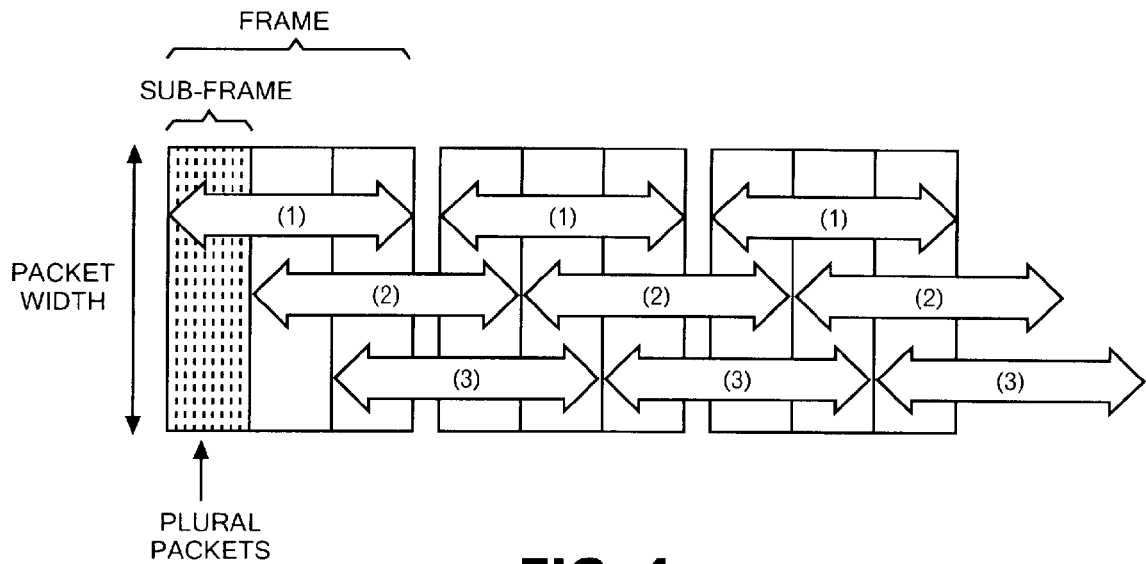
FIG. 4 is an explanatory diagram of the POB method of the present invention.

FIG. 4 shows a case where one frame consists of three sub-frames, and where one block code is applied to three sub-frames. Here, three block codes are used in total. One frame consists of a plurality of packets, and the vertical length of FIG. 4 indicates a packet width (bits). In a case where the information having the forgoing structure is encoded, a right and left arrow 1 indicates that the first sub-frame to the third sub-frame in the same frame are covered by a first block code; a right and left arrow 2 indicates that the second sub-frame to the first sub-frame in the next frame are covered by a second block code; and a right and left arrow 3 indicates that the third sub-frame to the second sub-frame in the next frame are covered by a third block code. In short, the three different block codes cover the different areas, respectively. As a result, the arrows 1 to 3 partially overlap, for example, in the third sub-frame.

Figure 5:
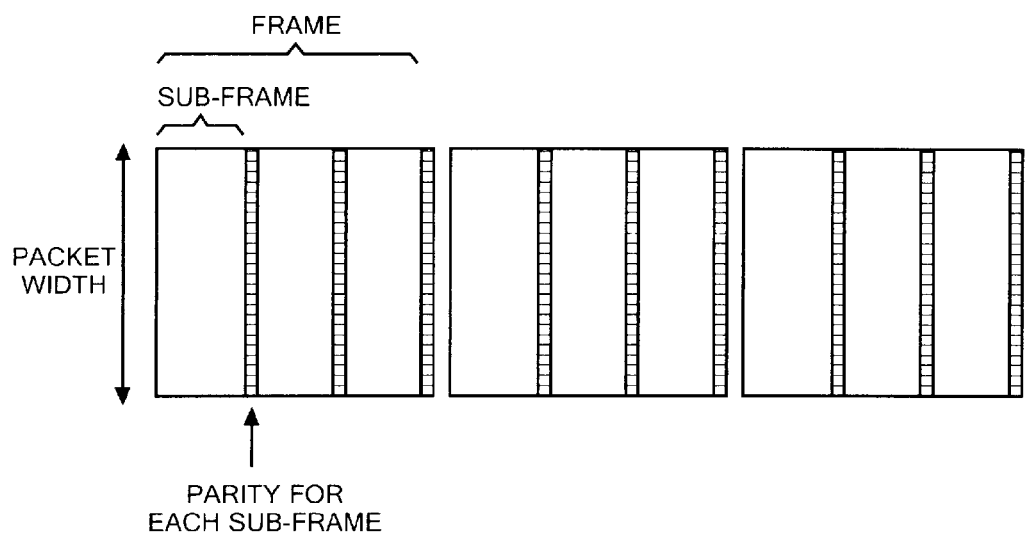
FIG. 5 is a diagram showing a configuration in a state after parities are generated in the configuration shown in FIG. 4.

FIG. 5 is a diagram of a structure after encoding by generating parities in the structure shown in FIG. 4. To be more precise, in FIG. 5, a parity corresponding to arrow 1 of FIG. 4 is added behind the third sub-frame, a parity corresponding to arrow 2 of FIG. 4 is added behind the first sub-frame, and a parity corresponding to the arrow 3 of FIG. 4 is added behind the second sub-frame. Accordingly, a location for adding a parity may be arbitrarily defined.

Figure 6:
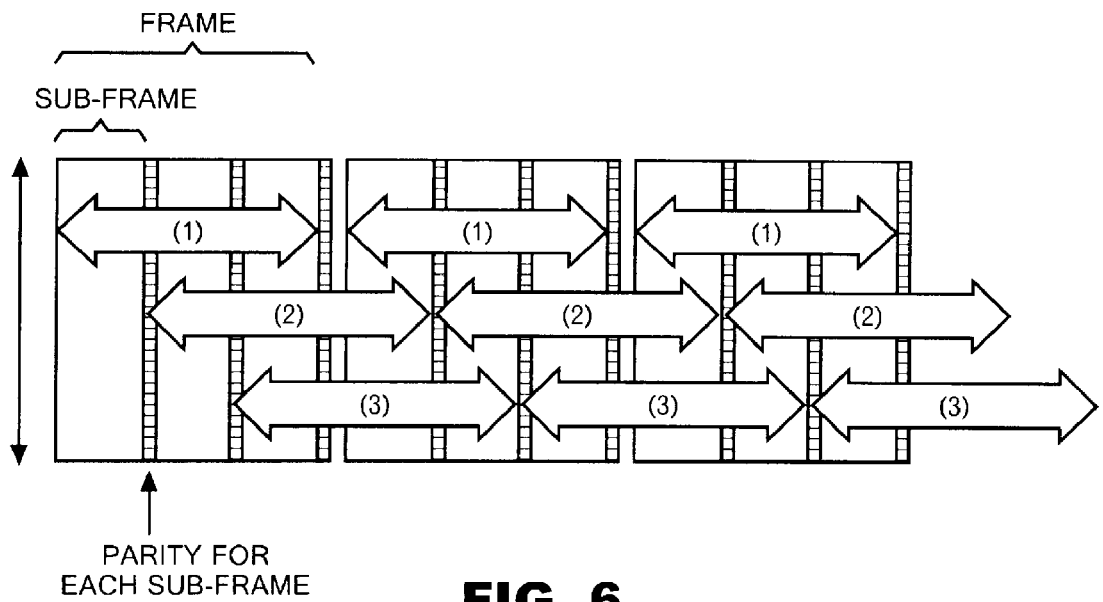
FIG. 6 is an explanatory diagram of a case where codewords shown in FIG. 5 are decoded.

FIG. 6 is a diagram illustrating the decoding of the codewords shown in FIG. 5. A right and left arrow 1 shows an area from the first sub-frame to the parity behind the third sub-frame. A right and left arrow 2 shows an area from the second sub-frame to the parity behind the first sub-frame in the next frame. A right and left arrow 3 shows an area from the third sub-frame to the parity behind the second sub-frame in the next frame. A syndrome of each of the areas can be computed by using a check matrix corresponding to a block code used for the area indicated by the corresponding number in FIG. 4. Accordingly, three syndromes are generated for one sub-frame, and each of the syndromes includes information on the sub-frame. Then, a packet recovery is performed by decoding the codewords using these three syndromes.

In a case of usual block codes, the block codes such as those indicated by the arrows 1 to 3 are applied to information in the same area. On the other hand, in the case of the present invention, the areas covered by the block codes 1 to 3 are shifted while partially overlapping one another as shown in FIG. 6. This results in an improvement in the error correction capability on a frame basis. To be more precise, there are block codes which include information on the same sub-frame, but which cover different areas, respectively. As a result, if there are no errors in the following two sub-frames, the maximum error correction capability can be exploited for the first sub-frame. This means that the parity information of an error-free sub-frame can be effectively used for error correction of the following sub-frames. In a case where errors can be corrected, the re-computation of syndromes results in the further enhancement of effective use. In addition, as a specific decoding method, it is possible to use a method similar to that for decoding currently-used block codes. In this case, the decoding needs to depend on the circumstances of what number sub-frame is to be corrected, and how many errors are included in related syndromes.

The POB encoding method may be employed when packet error information can be additionally received or detected. Packet error information indicates the presence of an error on a packet-wise basis in a given frame, specifically indicating the location within a frame and sub-frame and assigning a packet error number. This information on the location and number may be generated as a flag by setting a packet detecting bit when it has failed to recognize a packet correctly, as will be more fully described infra. Alternatively, it is also possible to receive information on the location and error number detected by another system that handles packets before the decoder. The error location and number can be received or detected in synchronization with a transmitted packet. For this reason, the system stores packet error location information and calculates the packet error number within a sub-frame.

Configuration of Encoder

Figure 7:
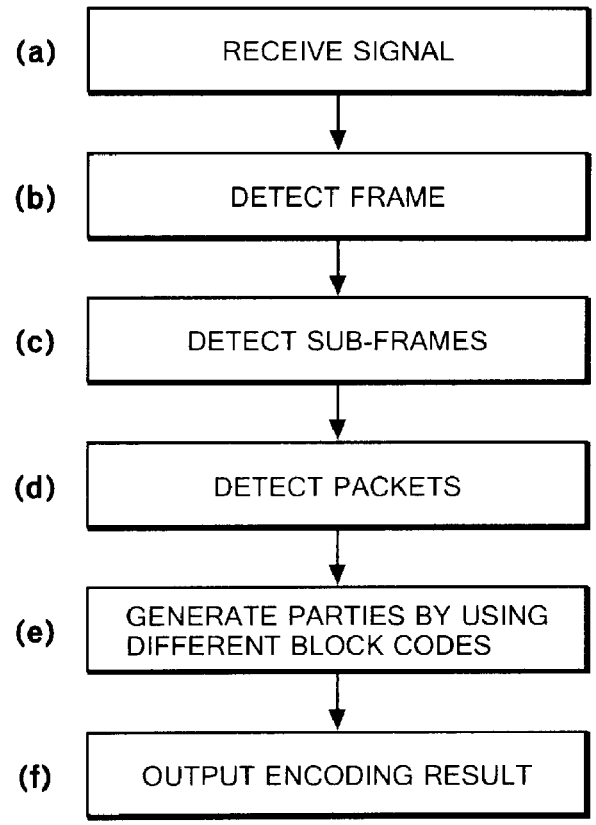
FIG. 7 is a diagram showing a flow of encoding in the present invention.

FIG. 7 depicts a flow cart showing the disclosed encoding method. Firstly, a signal transmitted on a frame basis is received (7-A). A frame of information is detected out of the received signal (7-B). After the frame is detected, sub-frames are detected (7-C). Here, the sub-frames are formed by dividing the frame into the predetermined number of frame components. Packets constituting a sub-frame are detected (7-D). Then, block codes which are related to sub-frames, and different from one another and parities of the number equal to that of the prepared block codes are concurrently generated (7-E). Finally, the generated parities and original information are output (7-F).

Figure 8:
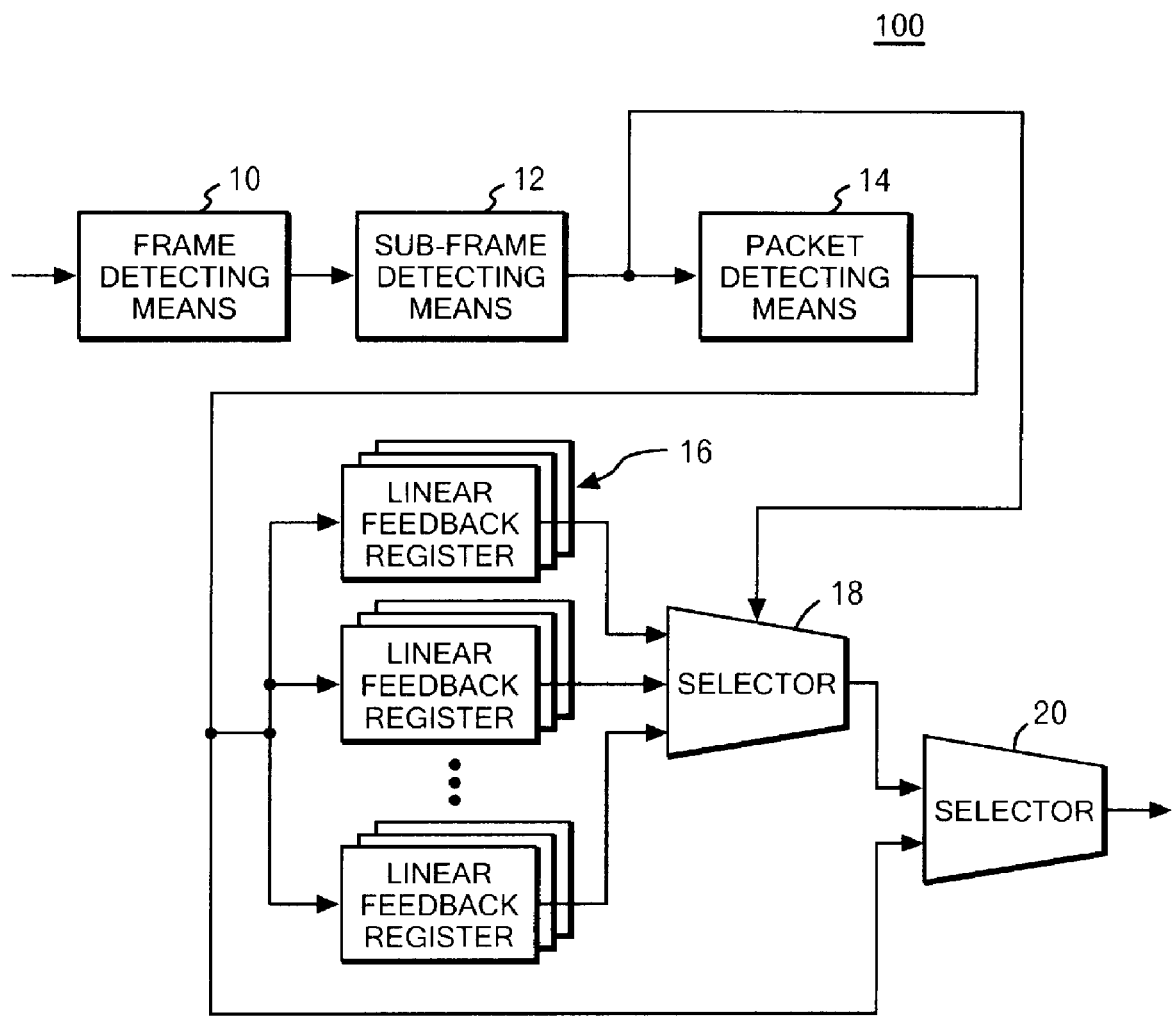
FIG. 8 is a diagram showing a configuration example of an encoder supporting the flow shown in FIG. 7.

FIG. 8 shows an embodiment of encoder 100 supporting the flow shown in FIG. 7. In a case where a header indicating the head of a frame is included the data, frame detecting means 10 detects the header by pattern-matching. In a case where a control signal synchronized with the head of the frame can be additionally obtained, the frame detecting means 10 uses the control signal. Sub-frame detecting means 12 and packet detecting means 14 operate in the same manner as the frame detecting means 10. In particular, when a frame structure is determined in advance, sub-frames and packets can also be detected by using a counter synchronized with the head of a frame. Since a plurality of different block codes are encoded for one sub-frame in an overlapping manner, it is necessary to use as many parity generating means as the number of the used block codes. However, it should be noted that the POB encoding method does not depend on the manner of selecting block codes. As a specific circuit configuration, circuits serving as the parity generator are needed in correspondence to the bit rate or the symbol rate in parities generated in accordance with selected block codes. FIG. 8 shows each of the parity generator circuits in a superimposed state. The processes in each of the parity generator circuits are concurrently executed. A number of linear feedback registers 16 are provided corresponding to the number of supported block codes. The feedback registers 16 are disposed in parallel. Inputs to the feedback registers 16 may be from the first one of the feedback registers 16, or from the last one thereof. A configuration of the feedback register 16 is determined according to the type of block code employed. A result of the sub-frame detection is transmitted to a selector 18 connected to the end of the feedback registers 16. Then, it is determined what parity is generated behind which sub-frame. A selector 20 functioning in the last step is for outputting information and parities in an arbitrary format.

Configuration of Decoder

A decoder for receiving and decoding information encoded in the POB encoding method of the present invention includes, for example, an embodiment having the following circuit elements.

Figure 9:
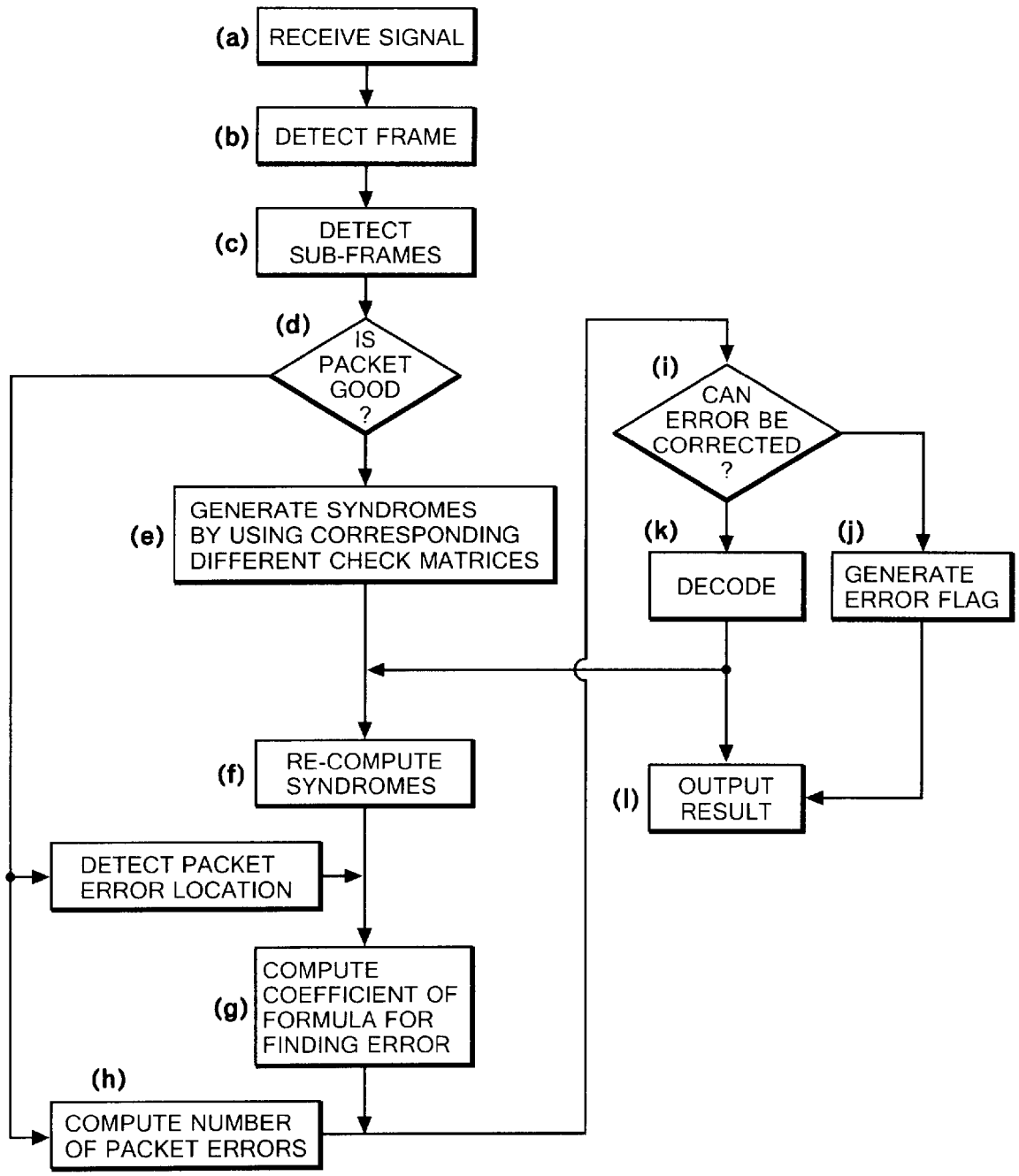
FIG. 9 is a diagram showing a flow of decoding in the present invention.
Figure 10:
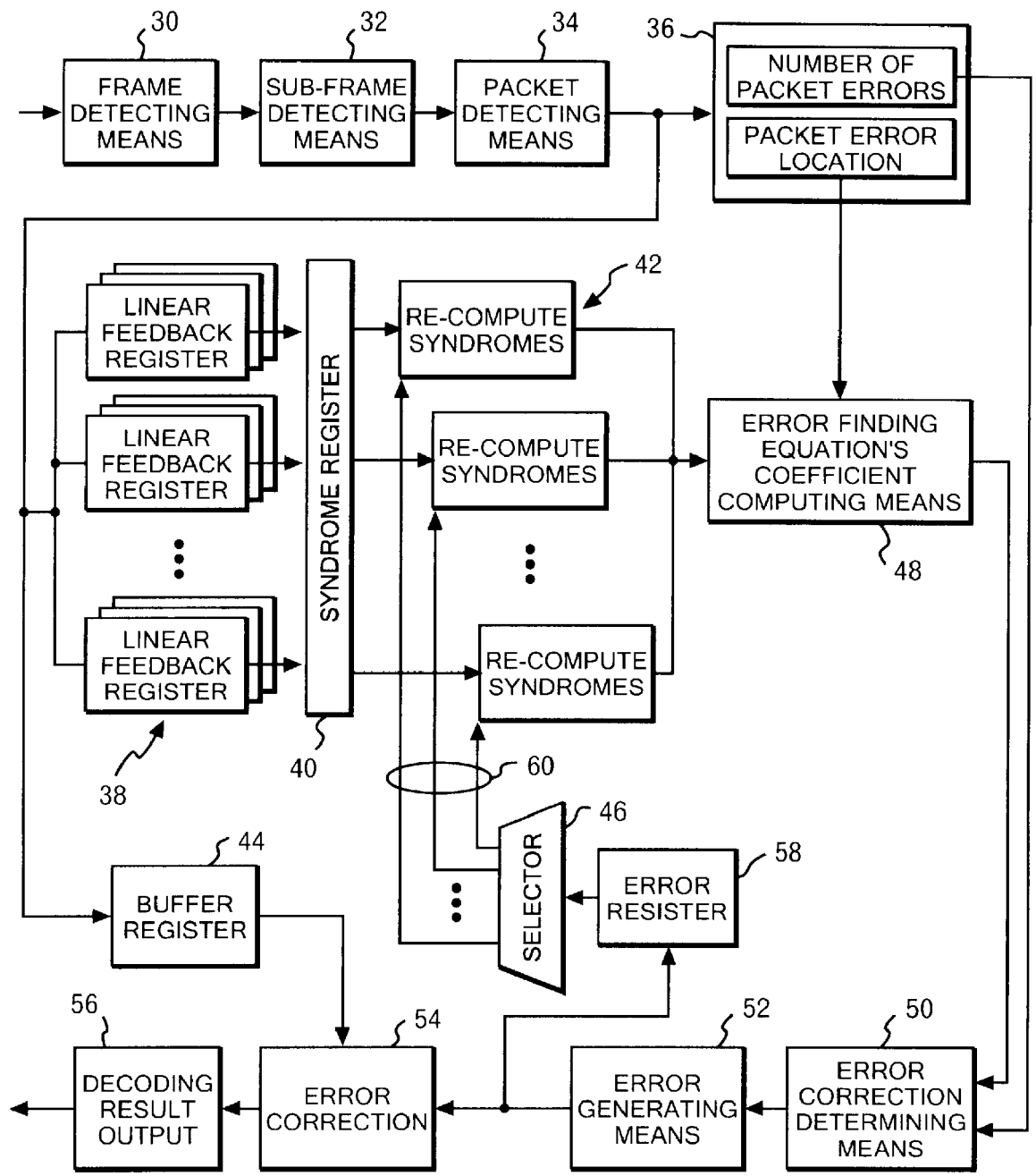
FIG. 10 is a diagram showing a configuration example of a decoder 200 for achieving the flow shown in FIG. 9.

FIG. 9 shows a flow of decoding in the present invention. FIG. 10 shows a decoder 200 supporting the flow shown in FIG. 9. After a signal is received (9-A), a frame is initially detected (9-B). Then, sub-frames are detected (9-C). Packets constituting each sub-frame are detected (9-D). If a packet error is detected, the number and location of the packet error are stored in a packet error register (36), and the number of the packet error in a sub-frame is counted. These are input to means 48 for computing a coefficient for an error finding equation (hereinafter, simply referred to as coefficient computing means 48) and error correction determining means 50 for determining whether or not errors can be corrected (see FIG. 10). Meanwhile, error syndromes are computed for the information blocks related to a sub-frame, by using check matrices corresponding to block codes used in encoding (9-E). Since information in one sub-frame is included in a plurality of block codes, a number of syndrome computers are needed corresponding to the number of block codes used for parity generation at the time of encoding. The syndromes are concurrently computed. As has been described in the configuration of the encoder, the POB encoding method does not depend on the manner of selecting block codes to be used. For this reason, a plurality of syndromes may be used for one block code. Therefore, a sufficient number of coefficient computing circuits are required corresponding to the number of syndromes used in one block code.

After the syndromes are computed, some of the syndromes need to be re-computed (9-F). The re-computed syndromes are those including information on a concerned sub-frame, and used in correcting errors in sub-frames preceding the concerned sub-frame in time. This syndrome re-computation is performed in a case where the errors can be corrected. After all the syndromes (each including information on the sub-frame preceding the concerned sub-frame) are re-computed (9-F) in the foregoing way, an error is detected by using the syndromes (9-G). Subsequently, it is determined whether the error can be corrected (9-I). If the error cannot be corrected, a flag is set for informing that the information includes the error (9-J). If the error can be corrected, the error is figured out, and then the error-correction and decoding are performed (9-K). At this time, if the error can be corrected, the error used in the correction is fed back to the syndrome re-computation performed when the subsequent sub-frames are corrected, as described above. Finally, the decoding result is outputted from Output Result (9-L). Note that it is not necessary to output the error flag.

Decoder 200 shown in FIG. 10 includes frame detecting means 30, sub-frame detecting means 32 and packet detecting means 34, as is the case with the encoder shown in FIG. 8. Syndrome calculating means 38 computes syndromes for each packet. The check matrices corresponding to the block codes used in encoding can be formed with linear feedback shift registers. Accordingly, the syndrome calculating means implements a sufficient number of linear feedback registers 38 corresponding to the number of unique block codes. In addition, input data is stored in buffer 44 and the syndromes are stored in syndrome register 40. The syndromes are re-computed (42) by using an error correction result of the preceding sub-frame. Then, the correct syndromes are input to the coefficient computing means 48. Here, data can be transmitted from the syndrome register 40 to the syndrome re-computation (42) in serial, or in parallel.

In a case where the packet detecting means 34 detects a packet error, or in a case where a circuit preceding the decoder receives data on a packet loss, the location of the packet error is stored (36), and the number of the packet error is concurrently recorded (36). The information on the packet error location is input to the coefficient computing means 48, which computes the coefficient by using the input data in combination with the re-computed syndromes. The number of the packet error is input to the error correction determining means 50. The determination of whether or not the error can be corrected depends on the structure of the POB code, as described later. In a case where the error can be corrected, error generating means 52 computes the error. As a result, the data stored in the buffer 44 is corrected (54), and then output. At this moment, if the error exists, the information on the error is stored in an error register 58. Then, as described above, the information on the error is fed back (60) to the syndrome re-computation via a selector 46 for the purpose of correcting an error in the subsequent sub-frame. Note that the decoder shown in FIG. 10 may have a configuration in which the error register 58 is excluded, and in which the information stored in the syndrome register 40 is updated by using the feedback of a result of syndrome re-computation (42), which would reduce the dedicated circuit area.

Here, descriptions will be further given of the case where the packets can be recovered as shown above in Table 1. In a case where there are three parities which overlap one another for one sub-frame, and where there is packet error location information, up to three packets per sub-frame can be recovered. However, three packets in a sub-frame can be recovered only when there are no errors in the first next sub-frame (j+1) and the second next sub-frame (j+2) (case D). The cases A to D indicate a combination of error correctable cases. For example, if only one error exists in a current sub-frame, the error can be corrected regardless of the number of errors in the other sub-frames. In addition, in these four error correctable cases, the coefficient for generating an error differs according to how many sub-frames precede the current sub-frame in a frame. Since there are three syndromes for up to three errors, three simultaneous equations are solved. The solution can be obtained by analytically solving the equations in each of the cases A to D. Moreover, the coefficient differs according to how many sub-frames precede the current sub-frame in a frame. By using the number of errors, it is determined which case is applicable. Then, the error finding coefficient is obtained.

Figure 11:
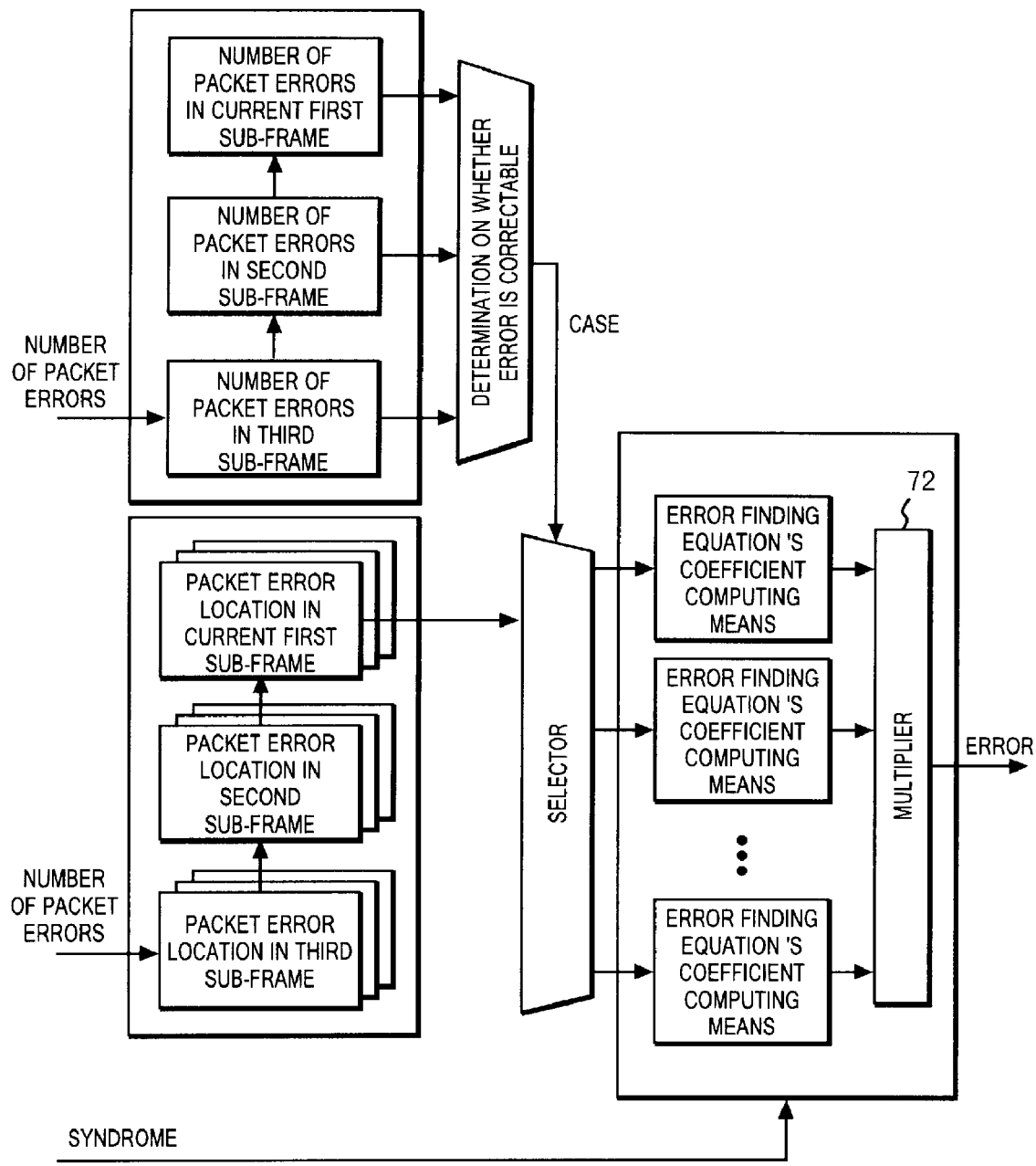
FIG. 11 is a diagram showing that a circuit scale can be reduced by using a last multiplication portion commonly.

Finding the error finding coefficient involves the computation of the numerator, and the computation of the denominator. In particular, the computation of the inverse number of the denominator requires a large-scale circuit. For this reason, the circuit scale can be remarkably downsized by combining the circuit for the computation of the numerator and the computation of the inverse number of the denominator, and by commonly using the circuit for the multiplication of the numerator and the inverse number of the denominator. FIG. 11 shows an example in which the scale of a circuit can be thus downsized. In addition, the syndrome is related only to the computation of the numerator, and thereby the input of the syndromes may be transmitted to a portion commonly used for the computation of the numerators.

Case Where Reed Solomon (RS) Code is Used as Block Code

A Reed Solomon code, which is often used as a non-binary block code, can be used as a block code of the POB code. Specifically, one packet is divided into pieces each having a symbol width used in RS codes, and then a RS code is applied so as to interleave the pieces having a total width equivalent to the packet width. A plurality of types of codes are prepared as the RS code, and the different types of RS codes are applied to the respective areas, each of which are related to a sub-frame, and which partially overlap one another. Thus, parities are generated.

Figure 12:
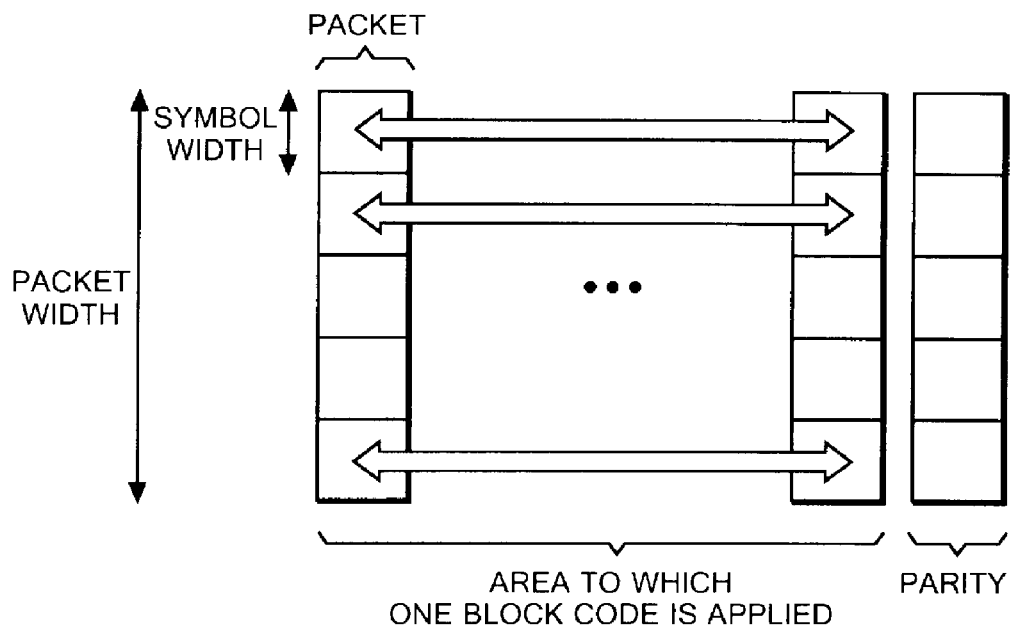
FIG. 12 is a diagram showing a structure at a time when an RS code of the present invention is applied.

FIG. 12 shows a structure at a time when RS codes are applied thereto. One packet is divided into pieces each having the symbol width used in the RS codes. The computation using the RS codes is performed on the packet information which includes the pieces each having such a symbol width, and which covers an area shown by any one of the arrows 1 to 3 in FIG. 4, and thereby parities are generated. Here, the number of partitions of sub-frames is arbitrary, and the structures of the RS codes are also arbitrary. Accordingly, a plurality of parities may be generated for one sub-frame. For example, as shown in Fig. when one frame is divided into three sub-frames, and a (n, n−1) code is used as the RS code, one parity is generated. Here, $\alpha$ which is a base of a relevant Galois field is used to obtain three different RS codes. Specifically, the packet information is multiplied by 1, $\alpha$ and $\alpha^2$, and then summed. Since the three RS codes thus obtained are different from one another, a POB code can be composed of the three RS codes. In particular, an RS code having 1 as a root is applied to an area from a first sub-frame to a third sub-frame in one frame, an RS code having $\alpha$ as a root is applied to an area from a second sub-frame in one frame to a first sub-frame in the next frame, and an RS code having $\alpha^2$ as a root is applied to a third sub-frame to a second sub-frame in the next frame.

Figure 13:
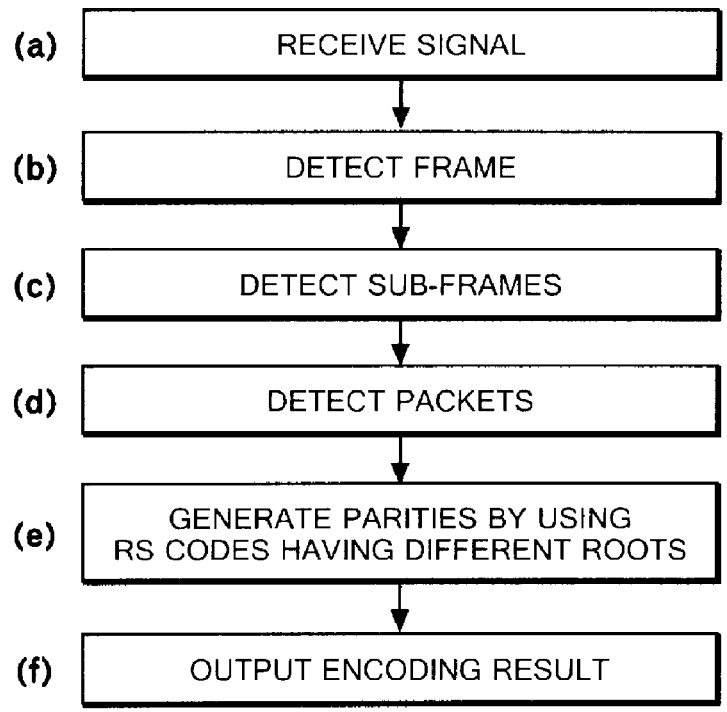
FIG. 13 is a diagram showing a flowchart of an encoding method shown in FIG. 12.
Figure 14:
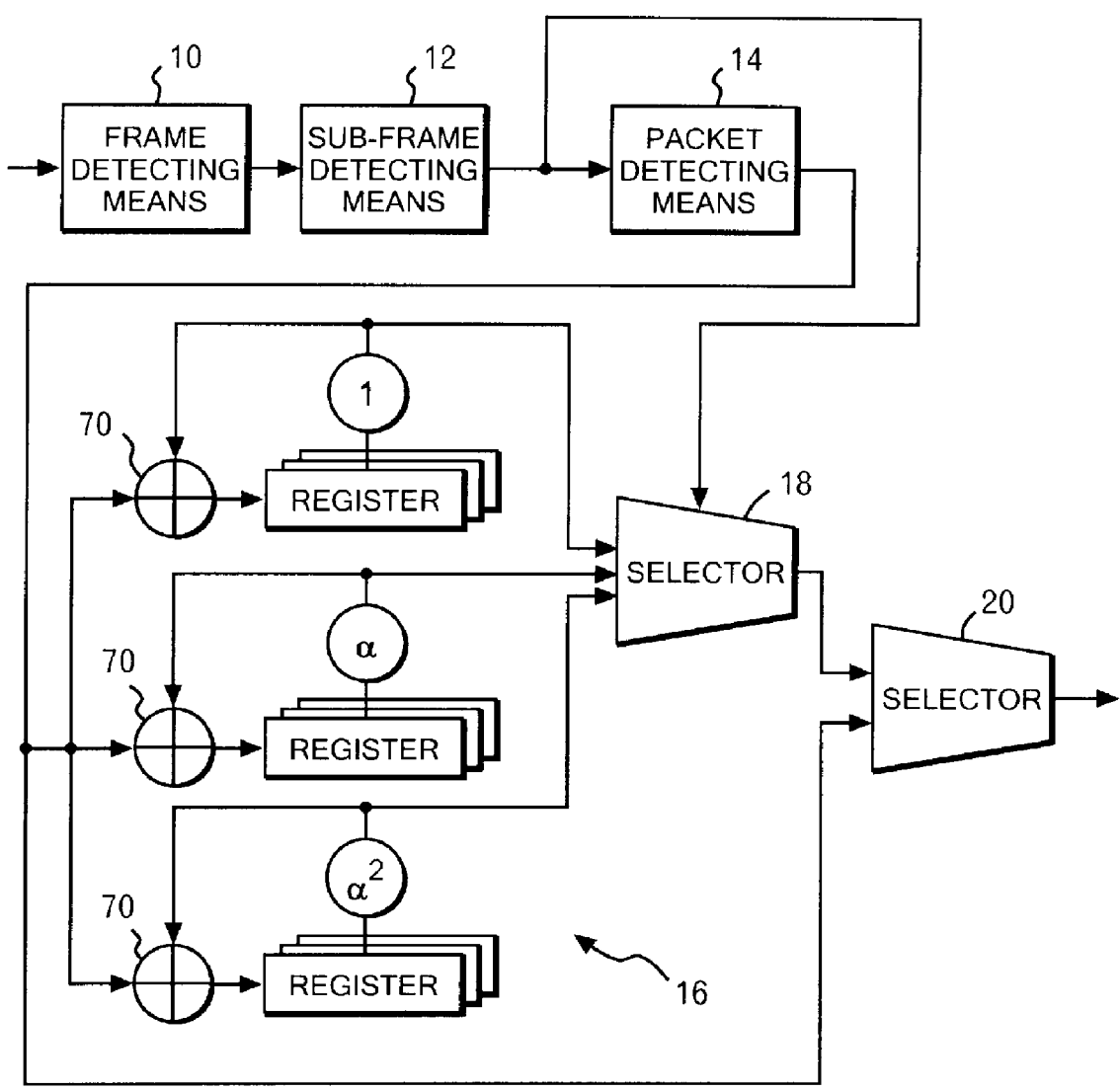
FIG. 14 is a diagram showing a configuration of an encoder for achieving the flow shown in FIG. 13.

FIG. 13 shows a flowchart of the encoding method in this case. FIG. 14 shows a configuration of an encoder 300 supporting this method. In FIG. 13, a receipt of a signal (13-A), a frame detection (13-B), a sub-frame detection (13-C), a packet detection (13-D) and an output (13-F) are the same as those shown in FIG. 7. In FIG. 14, the same reference numerals are given to the same components as those in FIG. 8. Three RS codes different from one another are prepared. The RS codes use RS codes as block codes, and have code roots of 1, $\alpha$ and $\alpha^2$, respectively, by using a primitive element a of an adequate Galois field GF($2^m$). By using the RS codes, parities are generated for all the sub-frames in an area which is related to the sub-frames, and which is to be covered by the RS codes (13-E). The parities can be arbitrarily arranged. Then, these are output as an encoding result. Multipliers 70 for 1, $\alpha$ and $\alpha^2$ are attached respectively to feedback sections of linear feedback shift registers 16 used here. Thus, the shift register 16 can compute parities by receiving and using the input information always obtained after the multiplication by fixed numbers. Note that, however, the three shift registers deal with sub-frames, the head of which is sequentially shifted to the next sub-frame. For this reason, the sub-frame detection result is connected to a selector 18 which is located at the end of the shift registers, and then it is determined which parity is output behind which sub-frame. A selector 20 functioning in the last step is for outputting information and parities in an arbitrary format.

Figure 15:
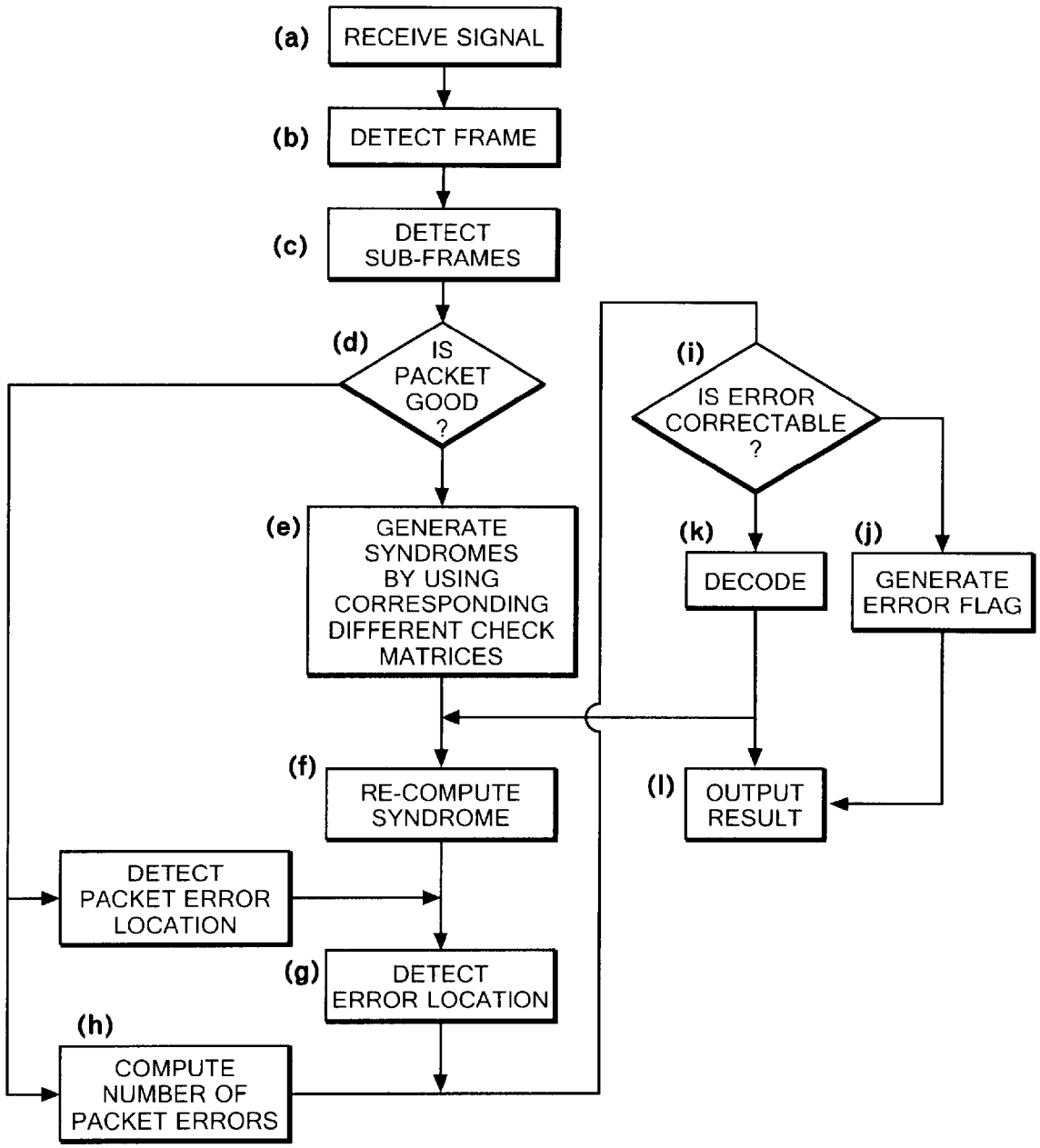
FIG. 15 is a diagram showing a flow of decoding in a case of RS codes.

Next, a decoder will be described. The decoder receives transmitted information to which parities corresponding to the three different RS codes are added, and generates syndromes by using check matrices corresponding to the respective RS codes. FIG. 15 shows a flowchart of this process. FIG. 15 is basically the same as FIG. 9. Here, it is supposed that the three RS codes having the code roots 1, $\alpha$ and $\alpha^2$, respectively, and that syndromes obtained from these parities are s0, s1 and s2. In this case, an error is figured out by using these parities and information on a packet error location. Since one packet is divided into a plurality of symbols, syndromes are obtained per frame up to the number of the partitions of the symbols.

Figure 16:
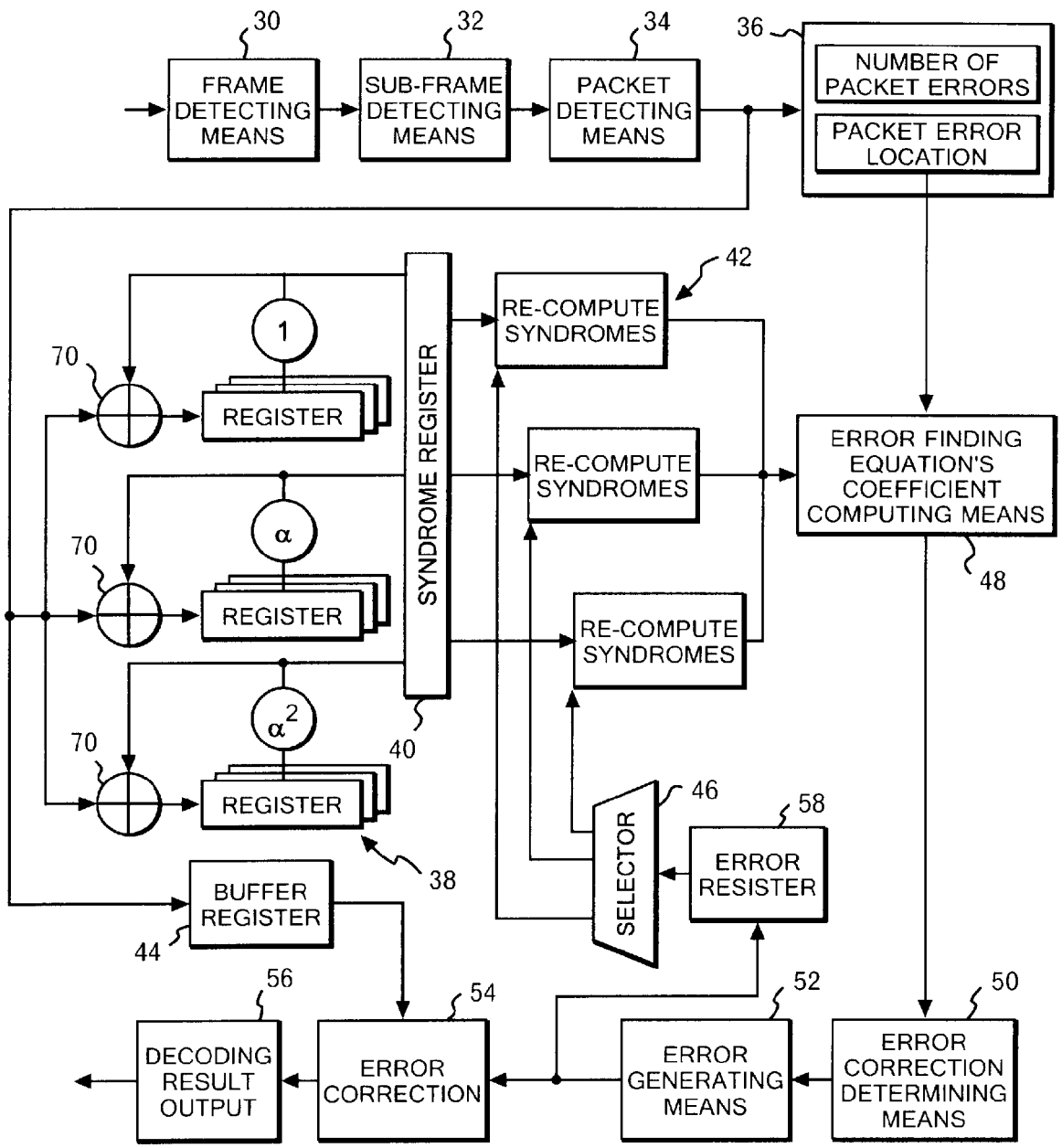
FIG. 16 is a diagram showing a configuration of a decoder for achieving the flow shown in FIG. 15.

FIG. 16 shows a configuration of a decoder 400 supporting the flow shown in FIG. 15. The configuration shown in FIG. 16 is basically the same as FIG. 10. In a case where the RS codes are used, syndrome computation circuits can be implemented with feedback registers 38 connected to multipliers 70 for 1, $\alpha$ and $\alpha^2$, which are the code roots. The syndromes are stored in a register, and the syndromes are re-computed by using an error correction result of a sub-frame handled at the previous time (42). The re-computed syndromes are then input to coefficient computing means 48. Meanwhile, the packet error information which indicates the number of packet error and the packet error location is received (36), and the information on the packet error location is input to the coefficient computing means 48. As shown in FIG. 8, an error can be computed by using the re-computed syndromes and the information on the packet error location. Moreover, a pattern of the error correctable cases is selected by using the number of the packet error, as shown in Table 1. An error detecting equation is specifically found according to a selected pattern of the cases A to D in Table 1, and the position of a sub-frame to be corrected. Then, the coefficient for this formula is generated. Lastly, an error is computed via a multiplier 72 illustrated in the last stage in FIG. 11. Once the error is computed, the error is corrected by multiplying the error by a coefficient based on the packet error location and the sub-frame position, and by adding the resultant error to information stored in the buffer 44. This computation is performed for all the symbols in a packet, and then a decoding result is outputted (56). If the error correction succeeds, the error is fed back to the syndrome re-computation circuits (42) via an error register 58 for the purpose of correcting the next sub-frame.

Encoder and Decoder in POB Encoding Method Using Concatenated Code

Figure 17:
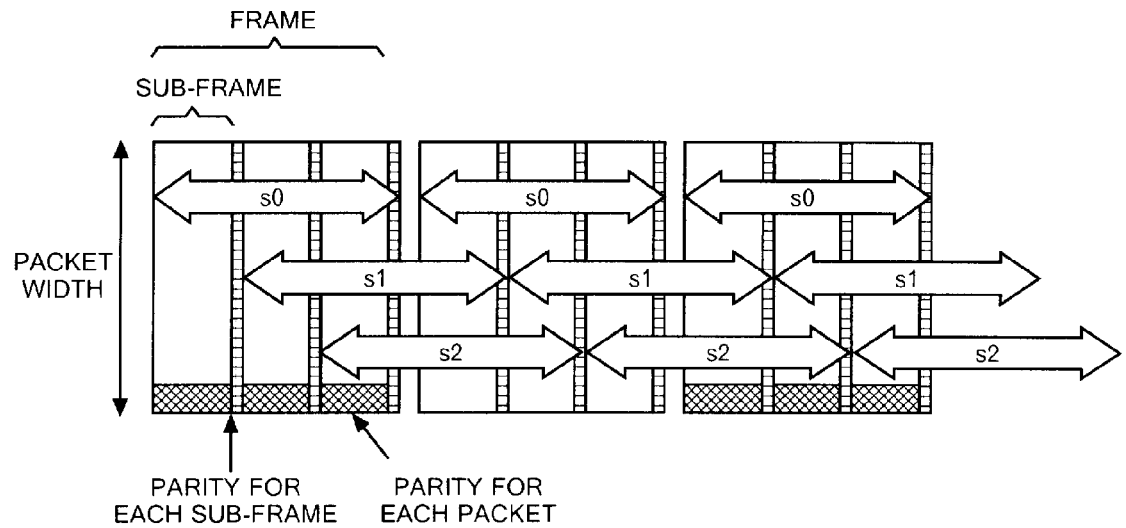
FIGS. 17A and 17B are diagrams showing frame structures of concatenated codes each including an outer code generated by using the POB encoding method.
Figure 17:
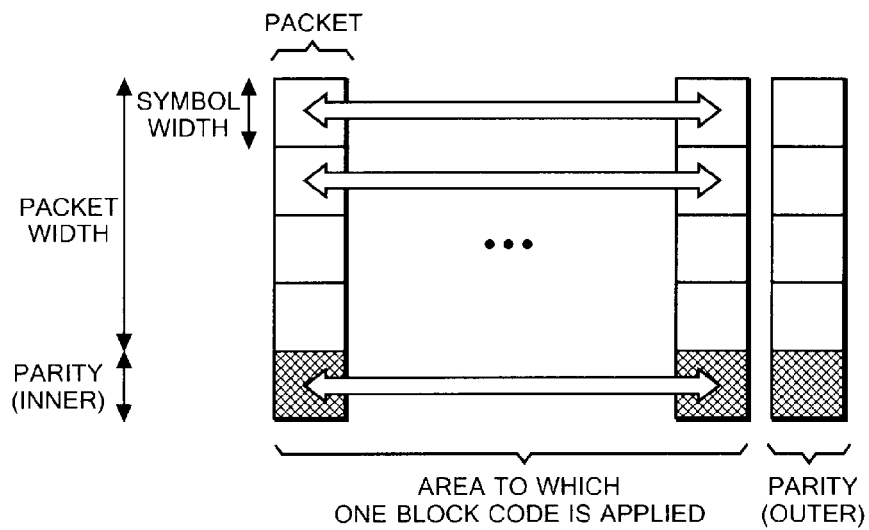

Although the POB encoding method is a very effective encoding method for pocket recovery, this method can be more remarkably effective if a concatenated code including a POB code as an outer code is used. In this case, an arbitrary code such as a convolutional code can be selected as an inner code, while the inner code is mainly configured of a block code (a Hamming code, a BCH code, an RS code and the like) in many cases. FIG. 17 shows a diagram of a frame structure using concatenated codes including outer codes in the POB encoding method. One block code is applied to one packet, and a parity is added to the end of the packet. For this reason, if a codeword to which an inner code is applied is regarded as one packet, an encoding method for the POB code is the same as the forgoing POB encoding method. Accordingly, a flowchart and a circuit configuration in this case further include an encoder and a decoder for block codes, which are inner codes. By adding such inner codes, an improvement in the correction capability for a random error in a packet can be expected. Moreover, this method allows a packet error to be surely extracted, and this makes it possible to achieve a smaller circuit scale of a decoder using outer codes in the POB encoding method. In addition, all the necessary processes can be carried out inside a closed circuit configuration without receiving packet error information from the outside.

Figure 18:
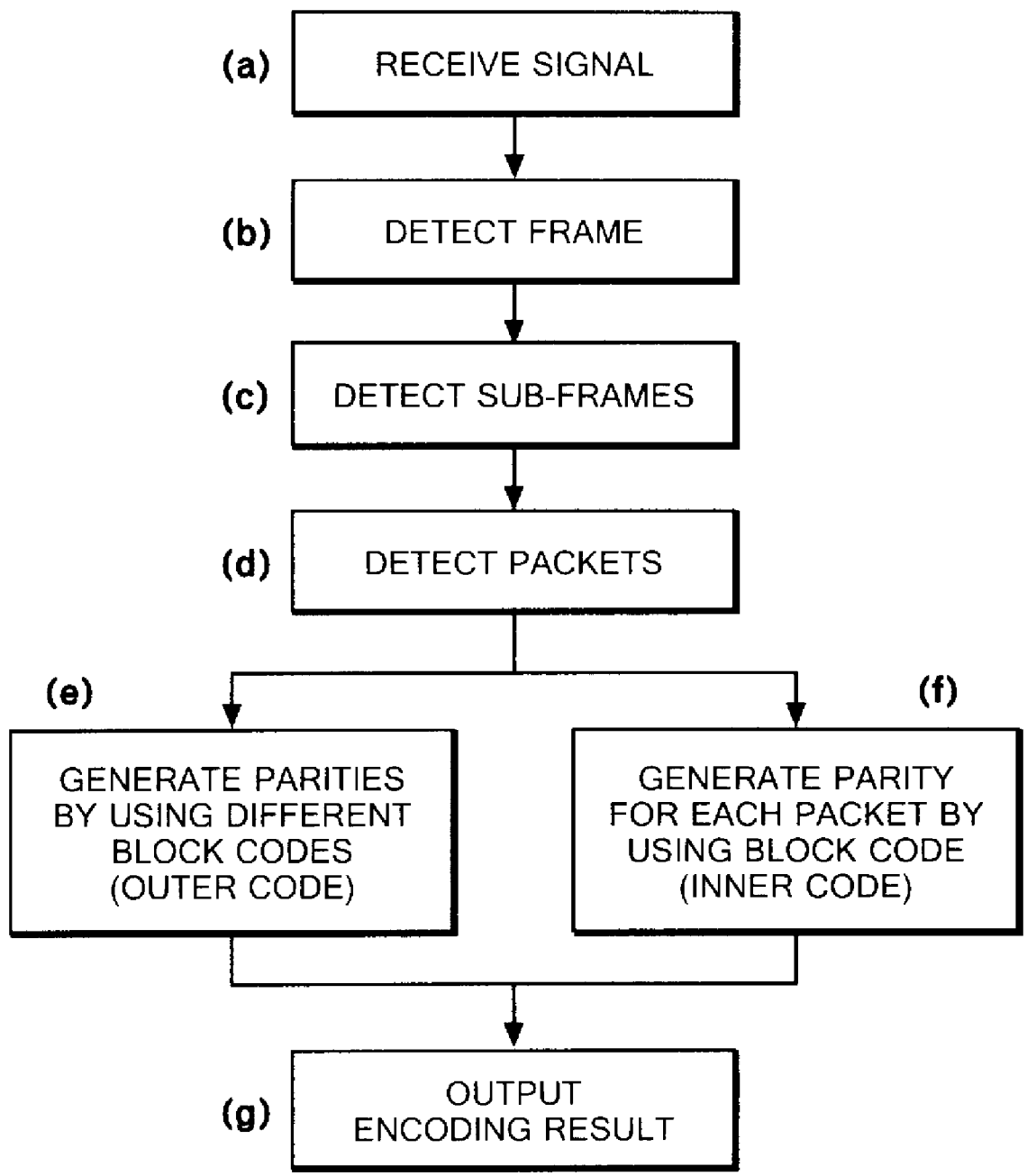
FIG. 18 is a diagram showing a flow of an encoding method in a case of FIG. 17.
Figure 19:
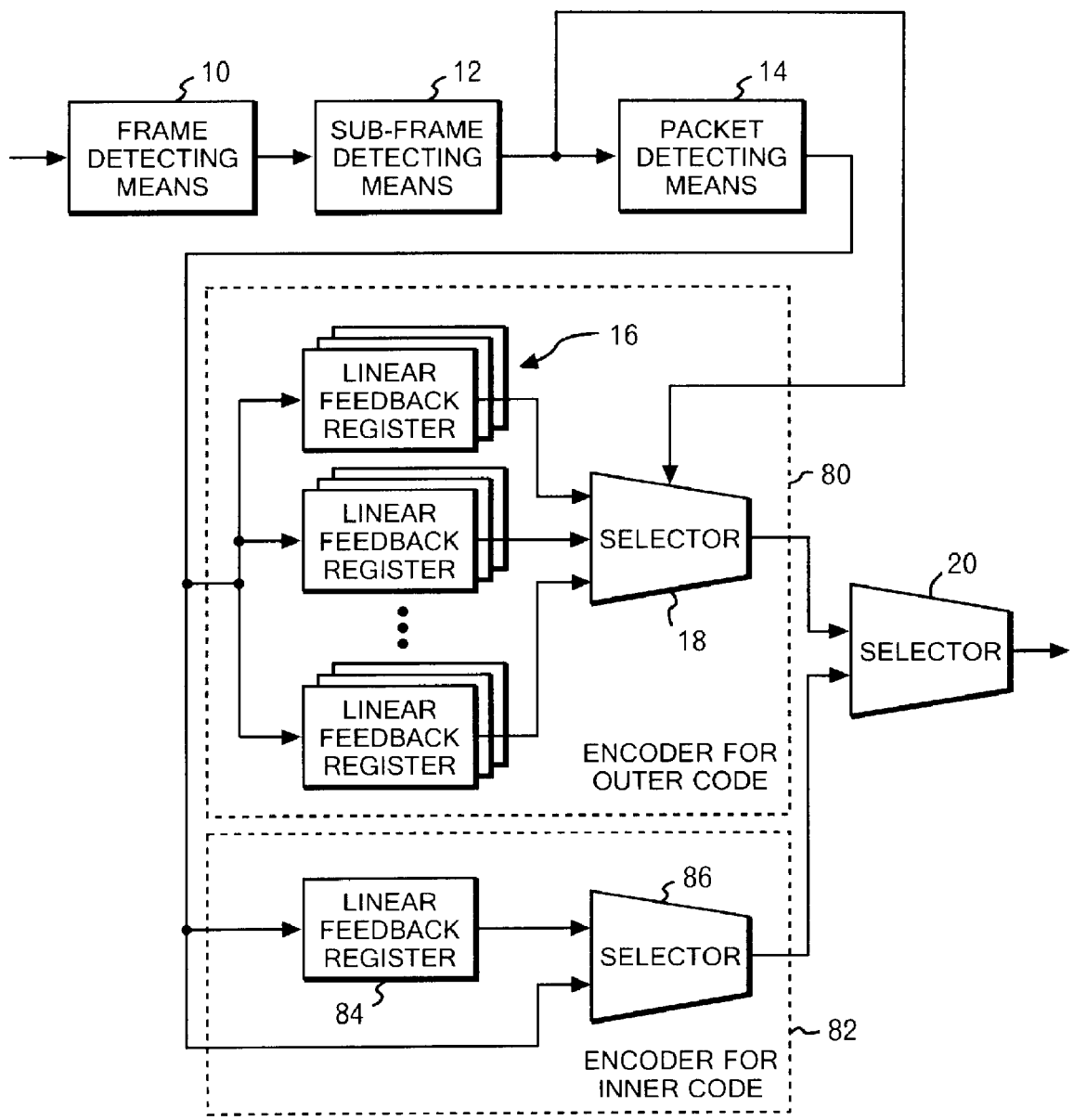
FIG. 19 is a diagram showing a configuration of an encoder for achieving the flow in FIG. 18.

FIG. 18 shows a flowchart, and FIG. 19 shows a circuit configuration 500. In FIG. 18, a receipt of a signal (18-A), a frame detection (18-B), a sub-frame detection (18-C), a packet detection (18-D) and an output (18-G) are the same as those in FIG. 7, but a parity generation part (18-E and 18-F) are largely different. Outer codes are generated in the same manner as those described in FIG. 7, but a parity of an inner code is concurrently generated for one packet. Although FIG. 18 shows that these processes are arranged in parallel, it is possible to employ a serial method in which the process for the inner code is executed first, and then the process for the outer code is executed. However, an information part of a packet is used for generating a parity not only for the outer code but also for the inner code, and thereby the method in which these processes are executed in parallel as shown in the FIG. 18 is faster than a serial process. Moreover, a higher priority is given to the process using the inner code in a part where the parities of the inner and outer codes overlap each other. In other words, a parity for the POB code which is the outer code is generated first, and then an inner code is generated for the parity. At last, an encoding result is output (18-G).

A basic configuration shown in FIG. 19 is the same as that of FIG. 8. In FIG. 19, the configuration has a distinctive feature in a parity generation part as is the case with the flowchart in FIG. 18. As in the description of the flowchart, parity generating means 80 for the POB code which is the outer code, and parity generating means 82 for the inner code execute their processes in parallel. As an encoder for inner codes, a linear feedback register 84 is used that is similar to the linear feedback register 16 in the encoder for outer codes. As is the case with the outer code, the linear feedback register 84 is used when a block code is used.

Figure 20:
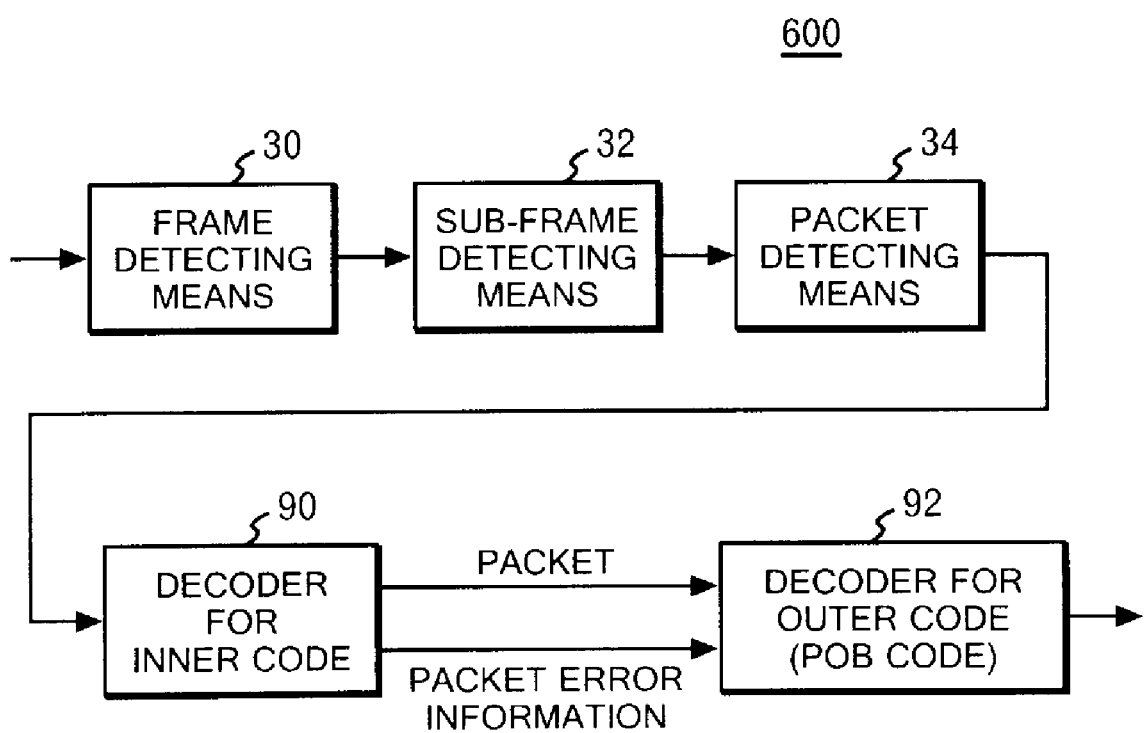
FIG. 20 is a diagram showing a configuration of a decoder in a case of FIG. 17.

FIG. 20 shows a configuration example of a decoder 600. In the encoder, the encoder for inner codes and the encoder for outer codes can be arranged either in serial or in parallel. In a case of the decoder, however, a decoder 90 for inner codes and a decoder 92 for outer codes are arranged in serial. The decoder 90 for inner codes handles information on a packet basis, and can employ a general decoding method for a block code since a packet is encoded by using an arbitrary block code. However, in a case where there is a packet error, and where the error cannot be corrected, the decoder 90 for inner codes detects the location of the packet error. Moreover, the decoder 90 for inner codes also detects the total number of packet errors, and outputs their location and the number. The decoder 92 for outer codes in the POB encoding method receives packets and packet error information, and performs decoding by using these.

Decoder for Inner Codes

Figure 21:
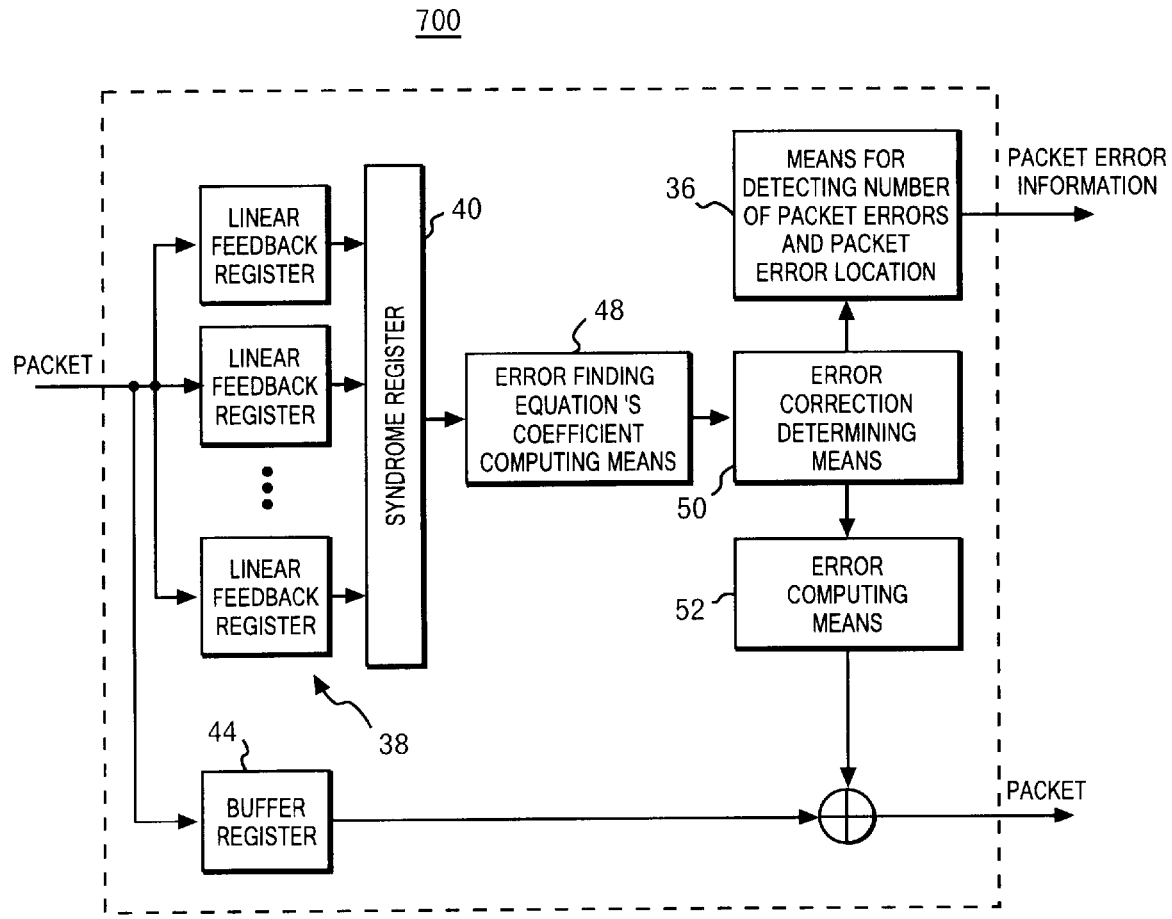
FIG. 21 is a diagram showing a configuration of a decoder for inner codes shown in FIG. 20.

FIG. 21 shows a decoder 700 for inner codes. In a case where a block code is used as the inner code, syndromes also can be computed by combining linear feedback registers 38. An inner code is often used for the purpose of correcting a random error in a packet. For this reason, a block code for correcting a plurality of bit errors is used in many cases. Thus, since the plurality of errors can be corrected, a plurality of parity bits are prepared. Syndromes of the number corresponding to the number of the parity bits are computed, and then are stored in a syndrome register 40. A coefficient of a polynomial of an error location is figured out by using the syndromes thus computed (48), and then an error is found. If the error can be corrected, the decoder for inner codes corrects the error in the packet by using the error thus found, and then outputs the packet. If the error cannot be corrected, the decoder for inner codes outputs the packet without performing any correction. In addition, the decoder for inner code outputs a flag indicating that the error cannot be corrected, and information on a packet location in a sub-frame. In other words, two types of information, that is the packet error flag and the packet error location, are collectively outputted as the packet error information, in addition to the packet that is the received information. In addition, FIG. 21 shows a buffer register 44. In a case of the decoder for inner codes, the size of a buffer may just be as large as the packet size. The decoder for inner codes may employ a general decoding algorithm for the used block code. The distinctive feature as a concatenated code with a POB code is that a packet error flag is generated, and that the location of the error in the sub-frame is extracted and outputted.

Decoder for Outer Code (POB Code)

As has been described above, the corrected packet and the packet error information are inputted from the decoder for inner codes to the decoder for outer codes. Thus, the information on the number of packet errors existing in an area covered by a block code, and on the locations of the packet errors is inputted to the outer decoder. Accordingly, the decoder for outer codes can be achieved with the same configuration as that in FIG. 10.

Hereinbefore, the present invention has been described by using the embodiments shown in FIGS. 1 to 21. However, the present invention is not limited to these embodiments. It is obvious to one skilled in the art that any modification may be made to the embodiments without departing from the spirit of the present invention.

What is claimed is:

1. A method of encoding a packetized data stream, comprising the steps of:
 preparing a frame including a plurality of packets;
 forming a plurality of sub-frames by dividing the frame; and
 generating a plurality block codes each corresponding to at least two neighboring sub-frames, at least two different block codes overlapping each other for each of the sub-frames, wherein each one of the plurality of block codes includes data from a previous sub-frame and a next sub-frame.

2. The method according to claim 1, wherein the block code generating step further comprises the step of adding a parity to one of the sub-frames corresponding to each of the block codes.

3. The method according to claim 2, wherein the block code generating step further comprises the step of adding a parity to one of the areas in the frame corresponding to each of the block codes.

4. The method according to claim 1, wherein the block code comprises a Reed Solomon (RS) code, and the different block codes (n, k) are encoded so as to satisfy the following equation:

$$\sum_{h=j-s+1}^{j} H_{ih} w_h = 0,$$

where, $H_i = [H_{i(j-s+1)}, H_{i(j-s+2)}, \ldots, H_{ij}]$,
$H_{ih} = [\alpha^{ih*n/s}, \alpha^{i(h*n/s+1)}, \ldots, \alpha^{i(h*n/s+n/s-1)}]$, and h, i, j and s are positive integers.

5. A method of encoding packet information, comprising the steps of:
 detecting a frame including a plurality of packets;
 detecting sub-frames in the detected frame;
 detecting packets in each of the sub-frames;
 encoding an outer code by generating parities by using at least two different block codes corresponding to each of the sub-frames, wherein each one of the at least two different block codes includes data from a previous sub-frame and a next sub-frame; and
 encoding an inner code by generating a parity corresponding to each of the packets in the block codes.

6. A method of decoding packet information, comprising the steps of:
 detecting a frame including a plurality of packets;
 detecting sub-frames in the detected frame;
 detecting packets in each of the sub-frames;
 computing syndromes for each block code corresponding to a plurality of sub-frames, wherein each block code includes data from a previous sub-frame and a next sub-frame; and re-computing a syndrome in a certain sub-frame in response to whether or not it is possible to correct an error of a packet in a sub-frame preceding the certain syndrome in time among the plurality of sub-frames corresponding to the syndromes previously computed.

7. The method according to claim 6, wherein the syndrome computing step further comprises the step of computing syndromes of the number equivalent to the number of different block codes which are formed so as to overlap one another for each of the sub-frames.

8. The method according to claim 6, wherein the block code comprises a Reed Solomon (RS) code, and a syndrome Si is calculated in the syndrome computing step by using the following equation:

$$S_i = \sum_{h=j-s+1}^{j} H_{ih} w_h, \quad S = \Sigma$$

Where $H_i = [H_{i(j-s+1)}, H_{i(j-s+2)}, \ldots, H_{ij}]$,
$H_{ih} = [\alpha^{ih*n/s}, \alpha^{i(h*n/s+1)}, \ldots, \alpha^{i(h*n/s+n/s-1)}]$, and h, i, j and s are positive integers.

9. The method according to claim 8, wherein a syndrome S' is computed in the syndrome computing step by using the following equation:

$$\begin{bmatrix} S'_0 \\ S'_1 \\ S'_2 \\ \vdots \\ S'_{r-1} \end{bmatrix} = \begin{bmatrix} S_0 \\ S_1 \\ S_2 \\ \vdots \\ S_{r-1} \end{bmatrix} + \begin{bmatrix} 1 & 1 & \cdots & 1 \\ \alpha^{e_0} & \alpha^{e_1} & \cdots & \alpha^{e_{q-1}} \\ \alpha^{2e_0} & \alpha^{2e_1} & \cdots & \alpha^{2e_{q-1}} \\ \vdots & \vdots & & \vdots \\ \alpha^{(r-1)e_0} & \alpha^{(r-1)e_1} & \cdots & \alpha^{(r-1)e_{q-1}} \end{bmatrix} \begin{bmatrix} be_0 \\ be_1 \\ \vdots \\ be_{q-1} \end{bmatrix}.$$

10. An encoder comprising:
a first frame detector element configured to detect packet frame boundaries of a packetized data stream;
a second frame detector element adapted to detect sub-frames in the frame;
a first packet detector element which detects packets in each of the sub-frames; and
a parity generator configured to generate parities corresponding to the sub-frames, each of the parities corresponding to each of at least two different block codes for each of the sub-frames, wherein each of the at least two different block codes includes data from a previous sub-frame and a next sub-frame.

11. The encoder according to claim 10, wherein the parity generator comprises a plurality of linear feedback registers corresponding to each of the block codes.

12. The encoder according to claim 11, further comprising an output device which outputs an encoding result obtained by generating the parities, wherein the output device comprises a selector for outputting the parities corresponding to the respective sub-frames while switching the parities from one to another.

13. A decoder comprising:
a first frame detector which detects a frame including a plurality of packets;
a second frame detector which detects sub-frames in the frame;
a first packet detector which detects packets in each of the sub-frames;
an error syndrome generator which generates syndromes for each block code
corresponding to a plurality of sub-frames computing syndromes for each block code corresponding to a plurality of sub-frames, wherein each block code includes data from a previous sub-frame and a next sub-frame, such that each block code partially overlaps multiple sub-frames; and
an error syndrome regenerator which regenerates a syndrome in a certain sub-frame in response to whether or not it is possible to correct an error of a packet in a sub-frame preceding the certain sub-frame in time among the plurality of sub-frames corresponding to the previously generated syndromes.

14. The decoder according to claim 13, further comprising:
a first logic element capable of detecting a location of an error in a packet by using the generated syndromes;
a second logic element capable of detecting a packet error by using the generated syndromes; and
an output device adapted to output a decoding result by using the detected error and its location in the packet.

15. The decoder according to claim 13, wherein the error syndrome generator comprises:
a linear feedback register for generating a parity corresponding to each of at least two different block code for each of the sub-frames; and
a register for storing the generated syndromes.

16. The decoder according to claim 15, wherein the error syndrome re-generator recalculates a syndrome in a first sub-frame by using an error generated for a sub-frame immediately preceding the first sub-frame in time among the plurality of sub-frames corresponding to the generated syndromes.

* * * * *